(12) United States Patent
Hayata

(10) Patent No.: US 10,971,822 B2
(45) Date of Patent: Apr. 6, 2021

(54) ANTENNA, MODULE SUBSTRATE, AND MODULE

(71) Applicant: KYOCERA Corporation, Kyoto (JP)

(72) Inventor: Kazuki Hayata, Yamatokoriyama (JP)

(73) Assignee: KYOCERA Corporation, Kyoto (JP)

( * ) Notice: Subject to any disclaimer, the term of this patent is extended or adjusted under 35 U.S.C. 154(b) by 16 days.

(21) Appl. No.: 16/344,187

(22) PCT Filed: Oct. 24, 2017

(86) PCT No.: PCT/JP2017/038281
§ 371 (c)(1),
(2) Date: Apr. 23, 2019

(87) PCT Pub. No.: WO2018/079521
PCT Pub. Date: May 3, 2018

(65) Prior Publication Data
US 2019/0319359 A1    Oct. 17, 2019

(30) Foreign Application Priority Data

Oct. 31, 2016 (JP) .............................. JP2016-212619

(51) Int. Cl.
| | |
|---|---|
| *H01Q 9/30* | (2006.01) |
| *H01Q 1/40* | (2006.01) |
| *H01Q 9/04* | (2006.01) |
| *H01Q 13/08* | (2006.01) |
| *H01Q 21/24* | (2006.01) |
| *H01Q 23/00* | (2006.01) |

(52) U.S. Cl.
CPC ................. *H01Q 9/30* (2013.01); *H01Q 1/40* (2013.01); *H01Q 9/0407* (2013.01); *H01Q 13/08* (2013.01); *H01Q 21/24* (2013.01); *H01Q 23/00* (2013.01)

(58) Field of Classification Search
None
See application file for complete search history.

(56) References Cited

U.S. PATENT DOCUMENTS

| | | | |
|---|---|---|---|
| 9,387,533 B1 * | 7/2016 | Heneveld | .................. B22C 9/04 |
| 2009/0058752 A1 * | 3/2009 | Lee | ...................... H01Q 21/062 |
| | | | 343/817 |
| 2014/0111394 A1 | 4/2014 | Seok et al. | |
| 2014/0125541 A1 | 5/2014 | Hong et al. | |
| 2014/0163664 A1 * | 6/2014 | Goldsmith | ....... A61B 17/12181 |
| | | | 623/1.11 |
| 2014/0203677 A1 * | 7/2014 | Takemoto | ............ H02K 1/2713 |
| | | | 310/71 |

FOREIGN PATENT DOCUMENTS

| | | |
|---|---|---|
| JP | H11-330833 A | 11/1999 |
| JP | 2008-141661 A | 6/2008 |
| JP | 2015-532570 A | 11/2015 |

* cited by examiner

*Primary Examiner* — Crystal L Hammond
(74) *Attorney, Agent, or Firm* — Procopio Cory Hargreaves and Savitch LLP

(57) ABSTRACT

An antenna includes a first conductor. The first conductor includes a shaft-shaped part and a plurality of flange-shaped projecting parts projecting from the shaft-shaped part to directions crossing an axial direction of the shaft-shaped part.

15 Claims, 10 Drawing Sheets

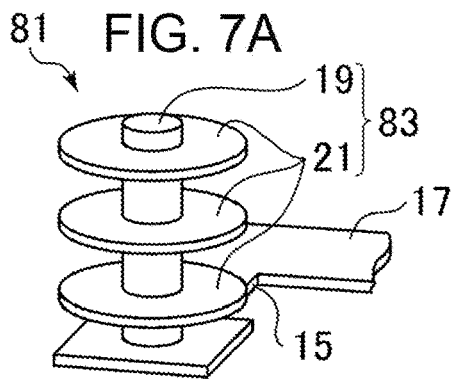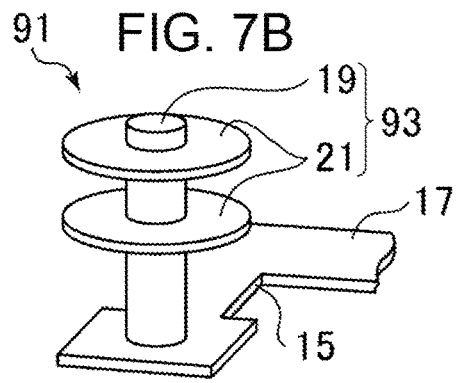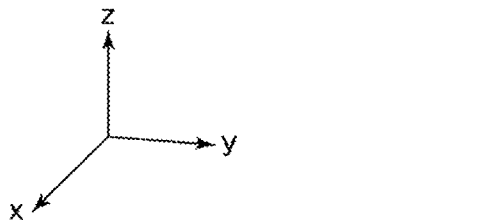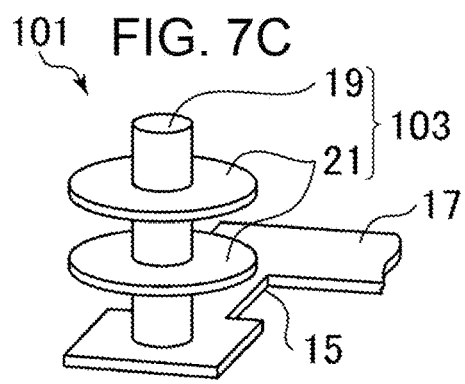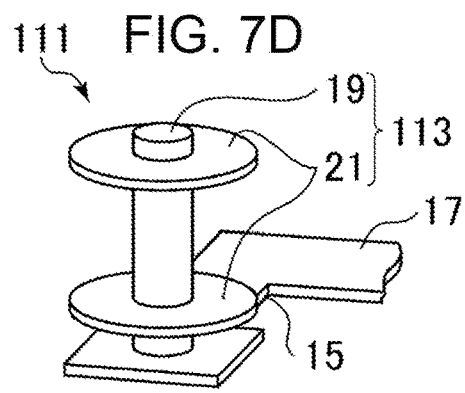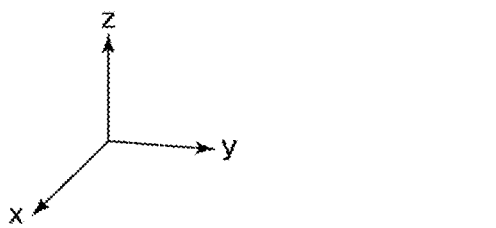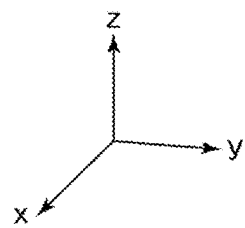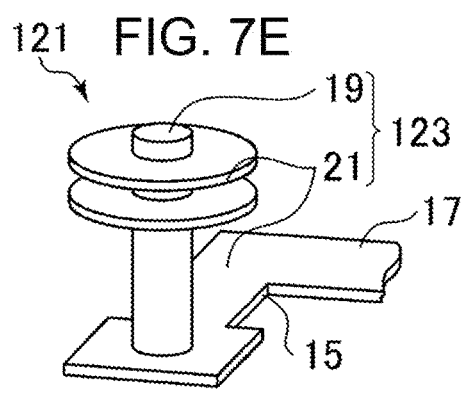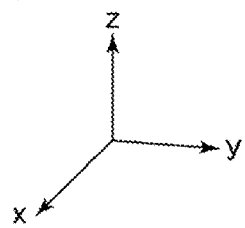

FIG. 9
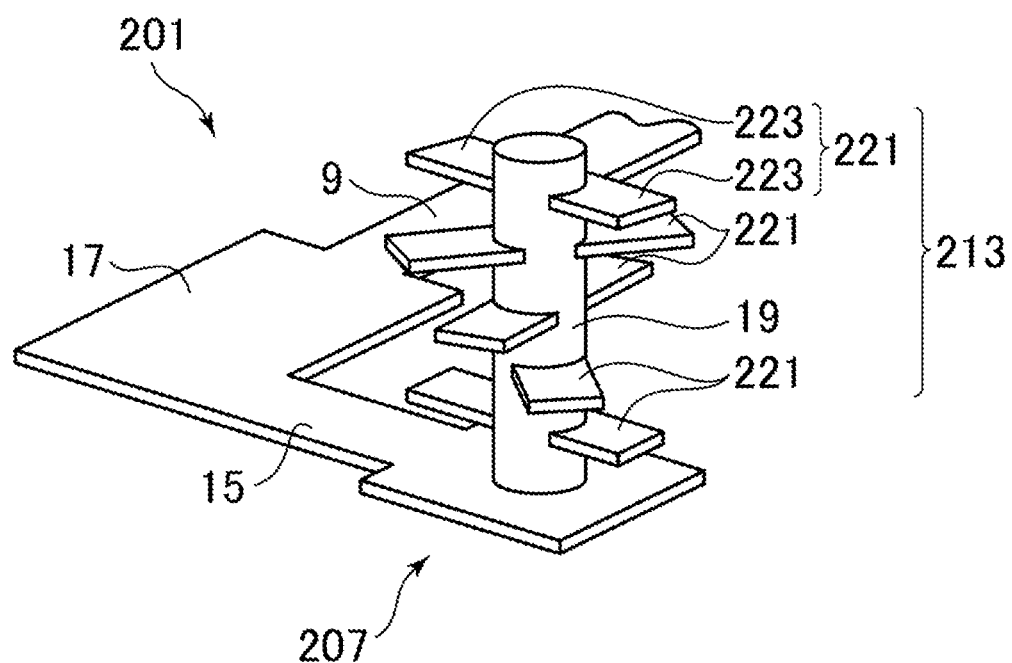
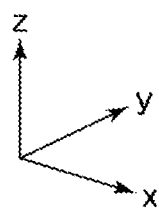

US 10,971,822 B2

ANTENNA, MODULE SUBSTRATE, AND MODULE

TECHNICAL FIELD

The present disclosure relates to an antenna, a module substrate, and a module.

BACKGROUND ART

As an antenna for transmitting/receiving radio waves, there are known a monopole antenna and other linear antennas (for example Patent Literature 1). A monopole antenna usually has a length of ¼ of the wavelength.

CITATION LIST

Patent Literature

Patent Literature 1: Japanese Patent Publication No. 11-330833

SUMMARY OF INVENTION

An antenna according to one aspect of the present disclosure includes a first conductor. The first conductor includes a shaft-shaped part and a plurality of flange-shaped projecting parts projecting from the shaft-shaped part to directions crossing an axial direction of the shaft-shaped part.

An antenna according to one aspect of the present disclosure includes a first conductor. The first conductor includes at least one flange-shaped projecting part which projects from the shaft-shaped part at a position separated from two ends in an axial direction of the shaft-shaped part to directions crossing the axial direction of the shaft-shaped part.

An antenna according to one aspect of the present disclosure includes a first conductor. The first conductor includes a shaft-shaped part and a plurality of projecting parts which project from the shaft-shaped part to directions crossing an axial direction of the shaft-shaped part, which are different from each other in the positions in the axial direction, and in which orientations where the amount of projections from the shaft-shaped part are the maximum cross each other.

A module substrate according to one aspect of the present disclosure includes the antenna described above, a second substrate which includes a dielectric and includes the first substrate, a wiring line which is located in at least one of an internal portion and a surface of the second substrate in a region closer to a center side than the first conductor in the second substrate, and a land which is located on the surface of the second substrate in the region on the center side and is connected to the wiring line.

A module according to one aspect of the present disclosure includes the module substrate described above and an electronic part mounted on the land.

BRIEF DESCRIPTION OF DRAWINGS

FIG. 7A, FIG. 7B, FIG. 7C, FIG. 7D, and FIG. 7E are perspective views showing antennas according to modifications.

FIG. 9 is a perspective view showing an antenna according to a second embodiment.

DESCRIPTION OF EMBODIMENTS

Figure 1:
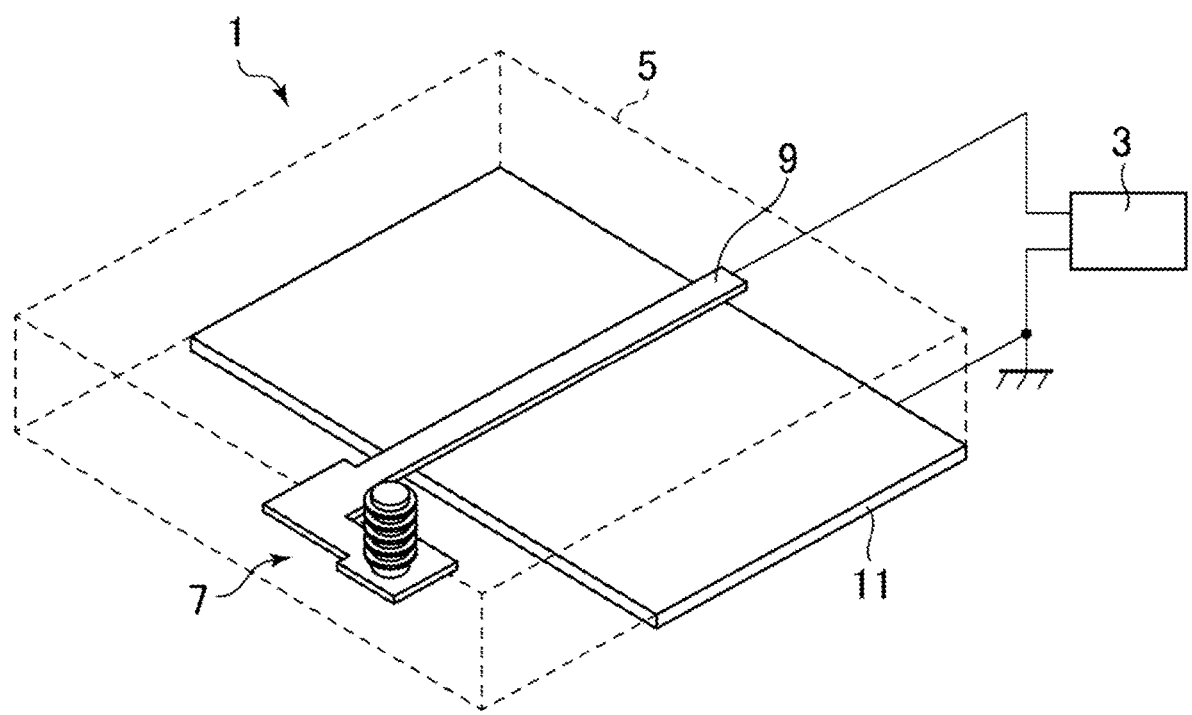
FIG. 1 is a perspective view showing an overall configuration of an antenna according to a first embodiment.

Below, embodiments according to the present disclosure will be explained with reference to the drawings. Note that, the drawings used in the following explanation are schematic ones. Size ratios etc. in the drawings do not always coincide with the actual ones.

Further, for convenience, sometimes an orthogonal coordinate system xyz will be attached to the drawings and will be referred to. In the antenna, any direction may be defined as "above" or "below". However, for convenience, sometimes the "upper surface" or "lower surface" or other term will be used where the positive side of the z-direction is the upper part.

In the explanation of modifications or the second embodiment, sometimes notations attached to the configurations in the first embodiment will be attached the configurations which are the same as or similar to the configurations in the first embodiment. Further, sometimes explanations will be omitted. Note that, even in a case where notations different from the notations attached to the configurations in the first embodiment are attached to configurations corresponding (similar) to the configurations in the first embodiment, items which are not particularly referred to are the same as those in the first embodiment.

First Embodiment (Overall Configuration of Antenna) FIG. 1 is a perspective view showing an overall configuration of an antenna 1. In this view, also an IC (integrated circuit) 3 connected with the antenna 1 is schematically shown.

The antenna 1 is for example one emitting and/or receiving an radio wave of circular polarization aimed at substantially all orientations. The frequency band in which the antenna 1 is utilized may be any band. For example, it may be one according to the WiGig (wireless gigabit) wireless communication standard of the 60 GHz band.

The size of the antenna 1 may be suitably set in accordance with the wavelength etc. of the frequency band in which the antenna 1 is utilized. In the following explanation, a case where the antenna 1 is a relatively small one utilized in a relatively high frequency band such as in the WiGig will be taken as an example. For example, the length of one side when viewed on a plane of the rectangular shape indicated by the dotted lines (first substrate 5) is 1 mm to 5 mm, and the thickness indicated by the dotted lines is 0.3 mm to 0.6 mm.

The antenna 1 is for example provided with a first substrate 5 configured by a dielectric (insulator) and with an antenna conductor 7, a wire line 9, and a ground plate 11 which are all configured by conductors provided on the first substrate 5.

The ground plate 11 is given a reference potential. When emitting radio waves, the IC 3 transmits a signal having a potential difference relative to the potential given to the ground plate 11 to the wire line 9 (supplies power to the wire line 9). The antenna conductor 7 converts the signal (current) from the wire line 9 to a radio wave and emits the result. Further, when receiving radio waves, the antenna conductor 7 converts a radio wave to a current. This current is input as a signal having a potential difference from the reference potential given to the ground plate 11 through the wire line 9 to the IC 3.

The first substrate 5 is for example a substantially plate-shaped member. The planar shape thereof may be suitable one. The first substrate 5 may be configured by a single material or may be configured by a plurality of materials. When it is configured by a plurality of materials, for example, the first substrate 5 may include a portion formed by stacking dielectric layers made of different materials in the thickness direction and/or may include a portion formed by impregnating a dielectric into a base material made of glass fabric or the like. The dielectric of the first substrate 5 is for example a ceramic and/or resin. The first substrate 5 for example contributes to holding of the antenna conductor 7, wire line 9, and ground plate 11 and contributes to shortening of the wavelength of the radio wave by being configured by a dielectric on at least the periphery of the antenna conductor 7.

The materials for the antenna conductor 7, wire line 9, and ground plate 11 are for example metal. The metal may be a suitable one such as Cu or Al. The antenna conductor 7, wire line 9, and ground plate 11 may be configured by the same materials as each other or may be configured by different materials from each other. Each of the antenna conductor 7, wire line 9, and ground plate 11 may be configured by a single material or may be configured by a plurality of materials. When it is configured by a plurality of materials, for example, each portion may be configured by stacking conductor layers made of mutually different metals in the thickness direction (z-direction) of the first substrate 5.

The antenna conductor 7 and wire line 9 are for example buried in the first substrate 5 in their substantial entireties. The ground plate 11 is for example positioned at the lower surface of the first substrate 5 and is separated from the antenna conductor 7 and wire line 9 in the thickness direction (z-direction) of the first substrate 5. Further, when viewed in the z-direction, the ground plate 11 is separated from the antenna conductor 7 and is superposed over the wire line 9. Note that, the ground plate 11 may be buried in the first substrate 5 as well.

By the ground plate 11 being superposed over the wire line 9 when viewed in the z-direction, a so-called microstrip line is configured. The distance in the z-direction between the wire line 9 and the ground plate 11 is for example constant. The shape of the wire line 9 may be suitably set. In the example in FIG. 1, the wire line 9 is configured by a layered pattern parallel to the first substrate 5 and linearly extends with a constant width. The shape of the ground plate 11 may also be suitably set. In the example in FIG. 1, the ground plate 11 is a layered pattern parallel to the first substrate 5. The dimensions of each of the wire line 9 and ground plate 11 and the distance between the two may be suitably set in accordance with the frequency band in which the antenna 1 is utilized and the like.

Note that, in the above explanation, the antenna 1 is defined including the wire line 9 and ground plate 11. However, the antenna 1 may be defined by only the antenna conductor 7 and its peripheral portion as well.

(Overall Configuration of Antenna Conductor)

Figure 2:
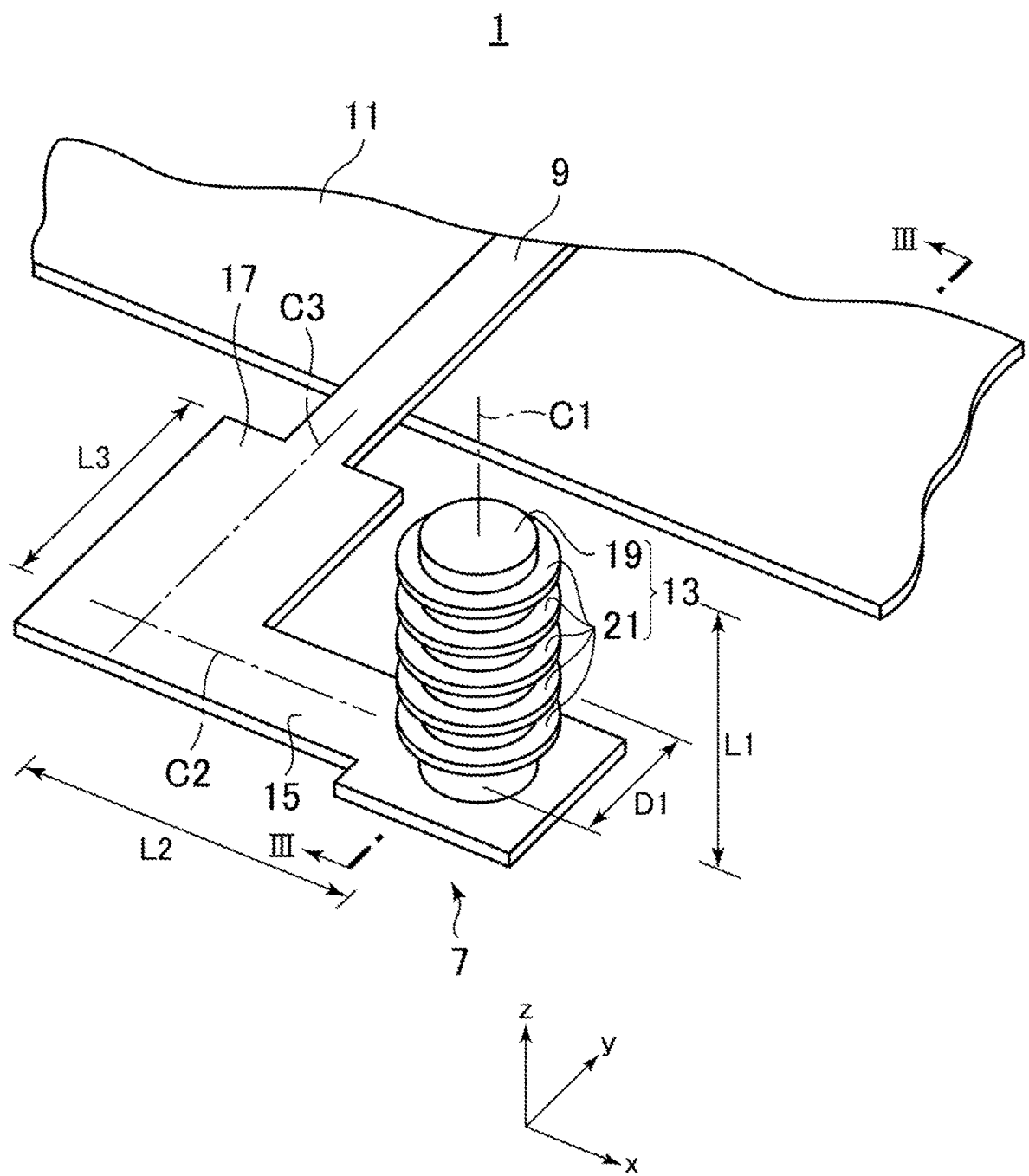
FIG. 2 is a perspective view showing a portion of the antenna in FIG. 1 in enlarged manner.

FIG. 2 is a perspective view showing a portion including the antenna conductor 7 in the antenna 1 in an enlarged manner. Note that, in this view, illustration of the first substrate 5 is omitted. The antenna conductor 7 for example has a first conductor 13, second conductor 15, and third conductor 17 which extend in directions different from each other and are connected to each other. The first conductor 13, second conductor 15, and third conductor 17 are configured so as to function like a monopole antenna in each solo conductor. For example, each of the first conductor 13, second conductor 15, and third conductor 17 is substantially long-shaped in a predetermined direction, and the length thereof (L1, L2, or L3) is substantially set to ¼ of the wavelength of the radio wave determined as the target of transmission and/or reception.

However, the length of the monopole antenna is the ¼ wavelength in principle. In actuality, however, considering impedance matching etc., it may be made shorter than the ¼ wavelength. The shortening rate is for example a few percentages or less of the ¼ wavelength. In the following explanation, unless indicated otherwise, the amount of adjustment in such an actual antenna will be ignored.

Further, the length is "substantially" ¼ wavelength for the first conductor 13. This is because, in the present embodiment, as will be explained later, the length of the first conductor 13 is made shorter than the ¼ wavelength by specially designing the shape of the first conductor 13. However, in the explanation of the principle of the mode of operation of the antenna 1 and the like, sometimes the length of the first conductor 13 will be regarded as the ¼ wavelength. Note that, by making the first conductor 13 shorter than the ¼ wavelength, the length thereof may become shorter than the length of the second conductor 15 and/or third conductor 17.

In the present embodiment, each of the first conductor 13, second conductor 15, and third conductor 17 is basically buried in the first substrate 5, therefore the wavelengths referred to concerning the lengths of these conductors are not ones in a free space, but ones in the first substrate 5. For example, in general, a wavelength $\lambda_g$ in the first substrate 5 is represented by the following equation:

$$\lambda_g = 1/\sqrt{\varepsilon_r} \times \lambda_0 = c/(\sqrt{\varepsilon_r} \times f)$$

where, $\varepsilon_r$ is a relative dielectric constant of the first substrate 5 (dielectric), $\lambda_0$ is the wavelength in a free space, "c" is the speed of light in a free space (in vacuum), and "f" is a frequency.

Each of the first conductor 13, second conductor 15, and third conductor 17 extend so as to intersect with each other and are connected. Specifically, the first conductor 13 extends along (for example parallel to) the thickness direction (z-axis direction) of the first substrate. The second conductor 15 extends from the lower end of the first conductor 13 in a direction (x-direction) crossing (for example perpendicular to) the first conductor 13. The third conductor 17 extends from the end part in the second conductor 15 on the opposite side to the first conductor 13 in a direction (y-direction) crossing (for example perpendicular to) both of the first conductor 13 and second conductor 15.

The first conductor 13 and the second conductor 15 intersect with each other, so correspond to linear polarization with crossing vibration directions. Further, each of the first conductor 13 and the second conductor 15 has substantially the length of ¼ wavelength. They are connected at their end parts with each other. Therefore, they are offset by 90° in phases from each other. Accordingly, the first conductor 13 and second conductor 15 as a whole can handle circular polarization. The same is true for the second conductor 15 and the third conductor 17. Further, by making the L-shape configured by the first conductor 13 and the second conductor 15 and the L-shape configured by the second conductor 15 and the third conductor 17 face mutually crossing directions, it is able to handle circular polarization for substantially all orientations.

Each of an intersection angle of the first conductor 13 and the second conductor 15 and an intersection angle of the second conductor 15 and the third conductor 17 is for example 90° (some tolerance possible), 90°±1°, or 90°±10°. By the L-shapes being formed in a perpendicular state or approximately perpendicular state in this way, for example, it becomes easy to handle circular polarization without circular bias. However, the intersection angle need not be approximately perpendicular either.

The intersection angle of the direction which the L-shape formed by the first conductor 13 and the second conductor 15 faces (from another viewpoint, the plane including the two conductors) and the direction which the L-shape formed by the second conductor 15 and the third conductor 17 faces is for example 90° (some tolerance possible), 90°±1°, or 90°±10°. In this case, for example, between the two L-shaped conductors, in the direction where the gain of one conductor is lower, the other conductor supplements the gain. However, the intersection angle need not be close to perpendicular either.

The first conductor 13 and the second conductor 15 are connected at substantially the end parts. In this case, for example, together with the first conductor 13 and the second conductor 15 substantially having the ¼ wavelength, offset of the phases of the two by 90° is facilitated. As a result, for example, it becomes easier to handle circular polarization without circular bias. However, the first conductor 13 and the second conductor 15 need not always have to be connected at the end parts. The same is true for the second conductor 15 and the third conductor 17.

From another viewpoint, the lengths of the first conductor 13, second conductor 15, and third conductor 17 may be designed using the connection position with another conductor as a reference so that the lengths substantially become the ¼ wavelength. Further, at this time, the connection position may be determined by using the position of the center line as a reference. Note that, the center line is for example a line connecting the centers in the figures (centers of gravity in the figures) of the cross-sections perpendicular to the long direction in the long direction. However, in the vicinity of the connection portion with the other conductor (portion where it is difficult to identify cross-section), the center line at the position away from this connection portion is extended. The center of gravity in the figure is the point where the total sum of primary moments in the figure becomes 0.

For example, the length L1 of the first conductor 13 is, on the center line C1 of the first conductor 13, a distance from the upper end of the first conductor 13 up to the center of the thickness of the second conductor 15. The center of the thickness of the second conductor 15, from another viewpoint, is the position in the z-direction of the center line C2 of the second conductor 15 at the position closest to the center line C1 of the first conductor 13 (intersecting point in a case where the center lines C1 and C2 intersect with each other). Note that, in the example in FIG. 2, the center lines C1 and C2 intersect with each other. Further, when the thickness of the second conductor 15 is sufficiently thin compared with the ¼ wavelength, the length L1 may be made the distance from the upper end of the first conductor 13 up to the upper surface of the second conductor 15 on the center line C1 of the first conductor 13. Note that, in the following description, sometimes the length L1 etc. will be referred to while ignoring the thickness of the second conductor 15.

Further, for example, the length L2 of the second conductor 15 is, on the center line C2 of the second conductor 15, a distance from the position closest to the center line C1 of the first conductor 13 up to the position closest to the center line C3 of the third conductor 17 (intersecting point in a case where the center lines C2 and C3 intersect with each other). Note that, in the example in FIG. 2, the center lines C2 and C3 intersect with each other.

Further, for example, the length L3 of the third conductor 17 is, on the center line C3 of the third conductor 17, a distance from the position closest to the center line C2 of the second conductor 15 up to the wire line 9. Note that, the third conductor 17 for example has a large width (x-direction) than the wire line 9 and a boundary of the two is for example the position where the width changes.

(Configuration of First Conductor)

The first conductor 13 has a shaft-shaped part 19 and one or more projecting parts 21 projecting from the shaft-shaped part 19 to directions crossing the axial direction (z-direction) of the shaft-shaped part 19. By providing the projecting parts 21, a fall of the antenna characteristics (for example peak gain) is suppressed while the length L1 of the first conductor 13 (shaft-shaped part 19) can be made shorter than the ¼ wavelength.

The shaft-shaped part 19 is shaped so as to substantially linearly extend with the direction (z-direction) in which the first conductor 13 must extend as the monopole antenna as the axial direction (long direction). Note that, in the present embodiment, the length of the first conductor 13 and the length of the shaft-shaped part 19 are the same. The shaft-shaped part 19 may be columnar as illustrated or may be shaped so that a layered pattern extends in the axial direction unlike FIG. 2. Further, the shaft-shaped part 19 may be solid as illustrated (without a void in the internal portion) or may be hollow (there is a void in the internal portion) unlike FIG. 2. The shapes of the cross-sections (transverse planes) of the shaft-shaped part 19 which are perpendicular to the axial direction thereof may be the same over the entire length of the shaft-shaped part 19 as illustrated or may be different according to the position in the axial direction unlike FIG. 2.

The shape of the transverse plane of the shaft-shaped part 19 may be circular as illustrated. Otherwise, unlike FIG. 2, it may be a convex polygon (including one chamfered at the corner portions, below, same true for corner portions of other shapes), a polygon which is not convex (concave polygon), a shape other than a circular shape which is comprised of convex closed curves, a shape which is not convex and is comprised of closed curves, or a shape formed by combination of single portions among them with each other. Note that, the "convex" referred to here means "convex" referred to in mathematics (convex set). The diameter or cross-sectional area of the shaft-shaped part 19 may be set according to for example the same design concept as the diameter or cross-sectional area in a conventional monopole antenna. Further, fine adjustment may be carried out considering the influence of the projecting part 21 as well.

For example, a plurality of projecting parts 21 are provided so that the positions of the shaft-shaped part 19 in the axial direction are made different from each other. The number and interval (pitch) of the projecting parts 21 may be suitably set. In the example shown, five projecting parts 21 are provided, and the intervals between them are substantially constant.

The one or more projecting parts 21 include for example at least one projecting part 21 which is separated from the two ends in the axial direction of the shaft-shaped part 19. In the example shown, all of the plurality of (five) projecting parts 21 correspond to projecting parts 21 which are separated from the two ends in the axial direction of the shaft-shaped part 19.

The distance between the upper end of the shaft-shaped part 19 and the projecting part 21 which is closest to this upper end and the distance between the lower end of the shaft-shaped part 19 and the projecting part 21 which is closest to this lower end may be suitably set. These two distances may be the same as each other, may be different, may be the same as the intervals between the plurality of projecting parts 21, or may be different. In the example shown, the distance from the upper end is shorter than the intervals between the plurality of projecting parts 21, while the distance from the lower end becomes longer than the intervals between the plurality of projecting parts 21.

Note that, in the end part (lower end) of the shaft-shaped part 19 which is connected with the second conductor 15, the second conductor 15 (or a portion thereof) projects from the shaft-shaped part 19. However, the second conductor 15 is set in its length etc. so as to configure a monopole antenna different from the first conductor 13. Accordingly, naturally the second conductor 15 is not a portion of the first conductor 13 and consequently not a projecting part 21.

The shapes and dimensions of the plurality of projecting parts 21 and the positions around the shaft of the shaft-shaped part 19 may be the same as each other as in the example shown or may be different from each other unlike FIG. 2.

In each projecting part 21, the position or range around the shaft of the shaft-shaped part 19 may be suitably set. For example, as illustrated, it may project from the shaft-shaped part 19 over the entire circumference around the shaft of the shaft-shaped part 19 or may project from the shaft-shaped part 19 in only a range of a part of the periphery of the shaft of the shaft-shaped part 19 unlike FIG. 2. When each projecting part 21 is provided only in the range of part of the periphery of the shaft, for example, the projecting part 21 is provided so that it looks as if it were projecting from the shaft-shaped part 19 (so that the projecting part 21 does not completely cover the shaft-shaped part 19) when viewed from at least an orientation which must deal with emission and/or reception of radio waves among the orientations around the shaft of the shaft-shaped part 19.

Further, when viewed on a plane, the amount of projection of each projecting part 21 from the shaft-shaped part 19 may be substantially constant over the whole circumference of the projecting part 21 as in the example shown or may be different according to the position on the periphery of the shaft unlike FIG. 2. Further, from another viewpoint, when viewed on a plane, the center of gravity in the figure of the outer edge of the projecting part 21 and the center of gravity in the figure of the cross-section of the shaft-shaped part 19 which is perpendicular to its axial direction may coincide as in the example shown or may deviate unlike FIG. 2. The projecting part 21, even if its size is relatively small, can reduce a probability of fall of the antenna characteristics (for example peak gain) when making the shaft-shaped part 19 short compared with a case where the projecting part 21 is not provided. Accordingly, a specific value of the amount of projection may be suitably set in a range exceeding relief shapes of the side surface of the shaft-shaped part 19 due to manufacturing error. A more preferred value may be suitably set based on for example simulation and experiments.

The thickness of each projecting part 21 may be substantially constant over the entirety of the projecting part 21 as in the example shown or may be different according to the position in the projecting part 21. Further, the thickness of the projecting part 21 may be relatively thin as illustrated or may be relatively thick unlike FIG. 2. A specific value of the thickness may be suitably set based on simulation and experiments. Further, the art of configuring at least a part of the antenna according to a layered pattern has been conventionally known. The thickness of the projecting part 21 may be made the same as the thickness of such an antenna.

It can be said that the shape of the projecting part 21 illustrated in FIG. 2 is a flange shape. Here, the flange shape is for example a shape that projects from the shaft-shaped part 19 over a relatively wide range around the shaft of the shaft-shaped part 19 and is relatively thin in thickness compared with the amount of projection or diameter D1. In the example shown, the projecting part 21 projects from the shaft-shaped part 19 over the entire circumference of the shaft of the shaft-shaped part 19.

Further, it can be said that the shape of the flange-shaped projecting part 21 illustrated in FIG. 2 is a disk shape that projects so as to surround the periphery of the shaft-shaped part 19. The "disk shape" referred to here need not always be a true circle when viewed on a plane. The "disk shape" means a flat plate shape.

(Configurations of Second Conductor and Third Conductor)

The second conductor 15 and third conductor 17 are for example configured by layered patterns having the thickness direction of the first substrate 5 (axial direction of the shaft-shaped part 19, z-direction) as the thickness directions. The planar shapes thereof are shapes that substantially linearly extend in the directions in which they should extend as monopole antennas (x-direction or y-direction). Each of the second conductor 15 and third conductor 17 functions in the same way as the conventional monopole antenna as a solo conductor, therefore the lengths, thicknesses, and widths thereof may be set in the same way as the conventional monopole antenna.

The planar shape (shape viewed in the z-direction) of the end part of the second conductor 15 which is connected with the first conductor 13 (shaft-shaped part 19) is for example formed so as to become broader than the shape of the transverse plane (xy cross-section) of the lower end of the shaft-shaped part 19. If forming the end part of the second conductor 15 in this way, for example, the shaft-shaped part 19 and the second conductor 15 are connected over the entire circumference of the shaft-shaped part 19. As a result, for example, depending on the manufacturing method of the antenna 1, electrical connection of the shaft-shaped part 19 and the second conductor 15 is reliably achieved. However, the planar shape of the end part of the second conductor 15 may have a size equal to or smaller than the shape of the transverse plane of the shaft-shaped part 19 as well.

In the example shown, the width of the portion other than the end part of the second conductor 15 is for example equal to the diameter of the shaft-shaped part 19. On the other hand, the end part of the second conductor 15 is made broader than the lower end of the shaft-shaped part 19 as described above, therefore the second conductor 15 becomes a shape that expands in width on the first conductor 13 side. However, the second conductor 15 may extend with a constant width by broadening a portion other than the end part and/or making the end part narrower.

In the example shown, the width of the third conductor 17 becomes broader than the diameter of the shaft-shaped part 19 and the width of the second conductor 15. By doing this, for example, the gain of the third conductor 17 can be raised. On the other hand, the widths of the wire line 9 and second conductor 15 which are connected to the two ends of the third conductor 17 are narrower than the width of the third conductor 17. Therefore, for example disruption in the directivity of current flowing in the third conductor 17 can be reduced. However, the width of the third conductor 17 may be equal to the diameter of the shaft-shaped part 19 and/or the width of the second conductor 15.

(Multilayer Substrate Including Antenna)

Figure 3:
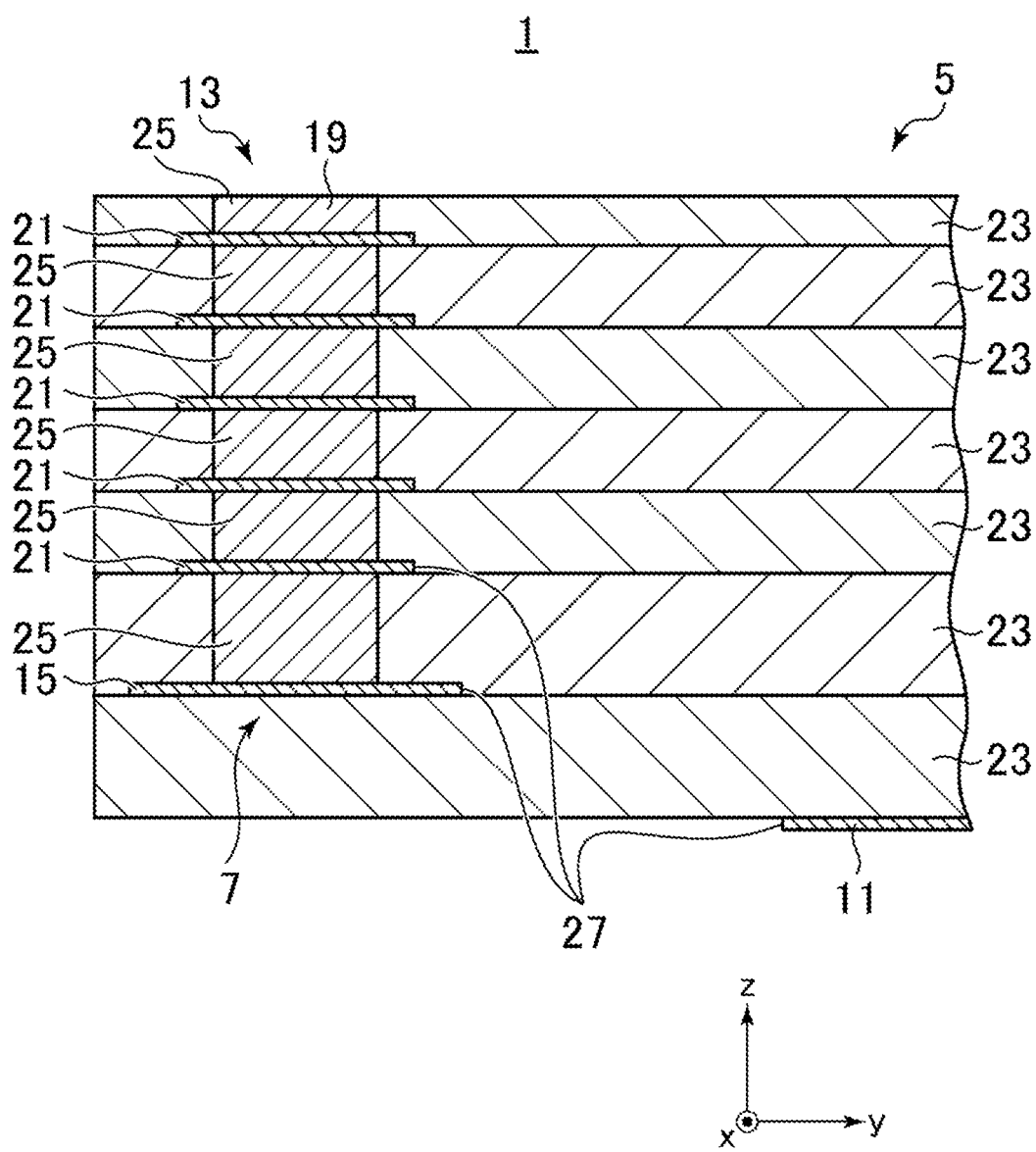
FIG. 3 is a cross-sectional view taken along the line in FIG. 2.

FIG. 3 is a cross-sectional view taken along the line in FIG. 2.

The configuration of the antenna 1 explained above is realized by for example the same structure as that of the multilayer substrate. Specifically, for example, the first substrate 5 is configured by stacking a plurality of dielectric layers 23. The shaft-shaped part 19 in the first conductor 13 is configured by one or more via conductors 25 passing through the dielectric layers 23. The projecting parts 21 in the first conductor 13, second conductor 15, and third conductor 17 (not shown in FIG. 3) are configured by conductor layers 27 positioned between the dielectric layers 23. The ground plate 11 is configured by a conductor layer 27 which is positioned at the surface of the dielectric layer 23 forming the lower surface of the first substrate 5.

Note that, unlike FIG. 3, a projecting part 21 which is configured by a conductor layer 27 (not shown) positioned on the upper surface of the first substrate 5 may be provided as well. Further, the ground plate 11 may be buried in the first substrate 5 by formation by a conductor layer 27 between the dielectric layers 23. A dielectric layer 23 covering the tip end of the first conductor 13 may be provided as well.

The plurality of dielectric layers 23 may be configured by materials the same as each other or may be configured by materials different from each other. As already explained, the material of the dielectric layer 23 is for example a ceramic and/or resin. One dielectric layer 23 may be configured by a single material or may be configured by a plurality of materials. When it is configured by a plurality of materials, for example, one dielectric layer 23 may be formed by superposing a resin layer and an inorganic insulation layer on each other. Further, the plurality of dielectric layers 23 may have the same thicknesses as each other or may have different thicknesses from each other. In the example shown, part of the plurality of dielectric layers 23 through which the shaft-shaped part 19 passes (four layers from the second layer to the fifth layer when counting from the top) are given the same thicknesses as each other.

The plurality of via conductors 25 may be configured by the same materials as each other or configured by different materials from each other. Further, the plurality of conductor layers 27 may be configured by the same materials as each other or configured by different materials from each other.

The via conductor 25 and the conductor layer 27 may be configured by the same materials as each other or configured by different materials from each other.

The plurality of conductor layers 27 may have the same thicknesses as each other or different thicknesses from each other. For example, the plurality of conductor layers 27 respectively positioned between the dielectric layers 23 have the same thicknesses as each other. Due to this, the plurality of projecting parts 21 have the same thicknesses as each other. One conductor layer 27 for example has the same thickness regardless of the position. Specifically, for example, the second conductor 15 and the third conductor 17 are configured by a common conductor layer 27 and have the same thicknesses as each other. However, one conductor layer 27 may have different thicknesses according to the positions as well.

The shaft-shaped part 19 is for example configured by connecting a plurality of via conductors 25 in the direction of stacking of the dielectric layers 23. Neighboring via conductors 25 may have a conductor layer configuring a projecting part 21 interposed between the two as illustrated. Otherwise, unlike FIG. 3, they may be directly bonded as well. That is, the shaft-shaped part 19 may be configured by a combination of a via conductor 25 and conductor layer 27 or configured by only a via conductor 25. Note that, in the antenna 1 after completion, it may be impossible to discriminate which of the above the configuration is.

Each of the plurality of via conductors 25 is for example configured by a conductor filled in a hole formed in the dielectric layer 23. That is, the via conductor 25 is solid. Due to this, the shaft-shaped part 19 becomes solid (columnar shape). Further, each of the plurality of via conductors 25 is for example given substantially a constant cross-sectional shape (including dimensions) in the thickness direction of the dielectric layer 23. Further, the shapes of the plurality of via conductors 25 may be for example made substantially the same as each other. Due to this, in the axial direction, the shaft-shaped part 19 has substantially a constant cross-sectional shape.

In FIG. 3, between every two adjacent dielectric layers 23 among all layers having shaft-shaped parts 19 passing therethrough, a projecting part 21 is provided. Further, the intervals between the plurality of projecting parts 21 become the same as the thickness of the dielectric layer 23. However, the projecting parts 21 may be selectively provided between the plurality of dielectric layers 23 (projecting parts 21 need not be provided between some of the dielectric layers 23). That is, the distance between the projecting parts 21 or the distance between the end part of a shaft-shaped part 19 and the projecting part 21 closest to this end part may be not less than the thickness of two or more dielectric layers 23.

The dielectric layers 23 basically have constant thicknesses. Via conductors 25 basically pass through the dielectric layers 23 so as to be perpendicular to the dielectric layers 23. Accordingly, the plurality of projecting parts 21 are parallel to each other and are perpendicular with respect to the via conductors 25. Note that, naturally there may be some inclination due to tolerances.

(Method for Manufacturing Antenna 1)

A method for manufacturing the antenna 1 may be the same as the method for manufacturing the multilayer substrate excluding the specific shape etc. Various known manufacturing methods may be utilized.

For example, the antenna 1 may be fabricated by the so-called "build-up method". In the build-up method, a process of forming one dielectric layer 23 and forming a via conductor 25 and/or conductor layer 27 with respect to this one dielectric layer 23 according to a need is repeated to successively stack and fasten a plurality of dielectric layers 23.

Further, for example the antenna 1 may be fabricated by a one-step stacking method of stacking ceramic green sheets forming the dielectric layers 23 and having conductive paste for forming via conductors 25 and conductor layers 27 arranged thereon and firing this.

In the various methods described above, the methods of forming the dielectric layers 23, forming the holes for arranging the via conductors 25, and forming the via conductors 25 and conductor layers 27 may be various known methods.

For example, each dielectric layer 23 may be formed by placing an uncured (liquid-state or film-state) thermosetting resin on a base material or a previously formed dielectric layer 23 and curing the same or may be formed by firing a ceramic green sheet.

Further, for example, a hole in which a via conductor 25 is arranged may be formed by wet etching and/or dry etching through a mask formed by photolithography or the like, may be formed by a laser beam narrowed in diameter, may be formed by punching, or may be formed by a drill. When the dielectric layer 23 is a photosensitive resin, it may be formed by photolithography as well.

Further, for example, each via conductor 25 may be formed by an electroless plating method and/or an electroplating method or may be formed by printing a conductive paste. Note that, a solid via conductor 25 is formed by making the plating sufficiently grow in a hole or filling conductive paste in the hole, while a hollow via conductor (see FIG. 8B and FIG. 8C) is formed by suitably stopping the growth of the plating or printing the conductive paste only on the inner surface of the hole.

Further, for example, each conductor layer 27 may be formed by an electroless plating method and/or an electroplating method or may be formed by printing a conductive paste. Further, the conductor layer 27 may be patterned by etching through a mask after formation on the entire surface of the dielectric layer 23 or may be formed on the dielectric layer 23 through a mask and patterned by removing the portion on the mask together with the mask.

(Antenna Characteristics)

Figure 4:
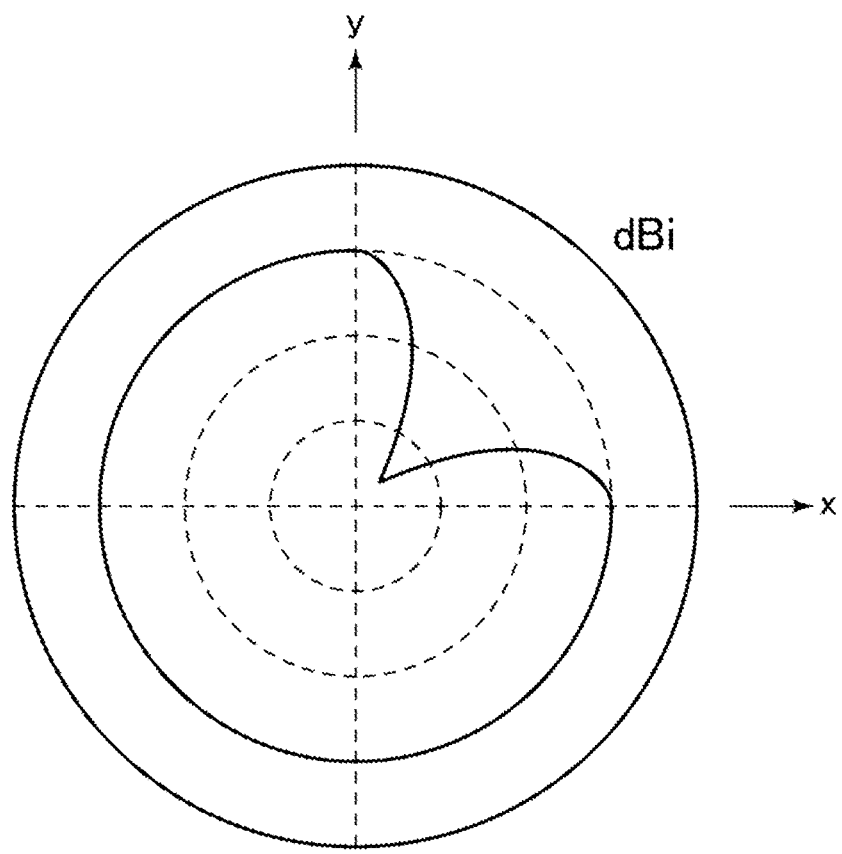
FIG. 4 is a view schematically showing an antenna characteristic on an xy plane of the antenna in FIG. 1.

FIG. 4 is a view schematically showing an emission pattern on the xy plane in the antenna 1. This view is based on the values obtained according to the simulation computations. However, details of the emission pattern obtained by computations in actuality are omitted.

As shown in this view, in the antenna 1, around the z-axis, the gain substantially equally becomes larger in orientations substantially in a range of 270°. The range of 270° includes an orientation that becomes the side where the first conductor 13 and second conductor 15 are positioned relative to the third conductor 17 (−y side) and an orientation that becomes the side where the second conductor 15 and third conductor 17 are positioned relative to the first conductor 13 (−x side). Note that, although not particularly shown, the gain of the orientation to the −y side becomes larger substantially equally in an orientation inclined to the −x side, orientation inclined to the +x side, orientation inclined to the −z side, and orientation inclined to the +z side and up to a relatively large gradient angle. Accordingly, the antenna 1 is advantageous for emission to the −y side and/or reception from the −y side.

Examples and Comparative Examples

Antennas in examples (Examples 1 to 4) set with specific dimensions with respect to the antenna 1 in the first embodiment and antennas in comparative examples (Comparative Examples 1 to 4) having different shapes from the antenna 1 in the first embodiment were assumed, and the antenna characteristics of them were found by simulation computations. As a result, it was confirmed that the shaft-shaped part 19 could be made shorter while suppressing a drop of the peak gain by providing the projecting parts 21. Specifically, this is as follows Note that, in the example according to the first embodiment, the shape of the shaft-shaped part 19 is columnar, and the projecting part 21 is disk-shaped having a constant thickness and having the axial center of the shaft-shaped part 19 as the center. Further, in the following description, the conditions which are not particularly referred to are common in the examples and comparative examples which are compared with each other.

Examples 1 and 2 and Comparative Examples 1 and 2

Both of Examples 1 and 2 are examples set with specific dimensions with respect to the antenna 1 in the first embodiment having the shape explained with reference to FIG. 2, and they are different from each other in some of the dimensions. Both of Comparative Examples 1 and 2 have shapes formed by removing the projecting parts 21 from the antenna 1 in the embodiment although not particularly shown, and they are different in some dimensions.

The conditions and simulation computation results in Examples 1 and 2 and Comparative Examples 1 and 2 are as follows:

|  | L1 (mm) | D1 (mm) | Peak gain (dBi) |
| --- | --- | --- | --- |
| Comp. Ex. 1 | 0.463 | — | 1.69 |
| Comp. Ex. 2 | 0.343 | — | 1.33 |
| Ex. 1 | 0.343 | 0.2 | 1.42 |
| Ex. 2 | 0.343 | 0.3 | 1.79 |

However, the length L1 of the shaft-shaped part 19 here is the height of the shaft-shaped part 19 from the second conductor 15. The lengths L1 in Comparative Example 2 and Examples 1 and 2 are the same as each other, and they are shorter than the length L1 in Comparative Example 1. D1 is the diameter of the projecting part 21 (see FIG. 2). The diameter D1 in Example 2 becomes larger than the diameter D1 in Example 1. In Comparative Examples 1 and 2, the projecting part 21 is not provided, therefore the diameter D1 is "−". The diameter of the shaft-shaped part 19 is common among Examples 1 and 2 and Comparative Examples 1 and 2 and is 0.15 mm. The number of projecting parts 21 in Examples 1 and 2 is five.

As described above, when the shaft-shaped part 19 is made shorter (Comparative Example 2) relative to Comparative Example 1, the peak gain falls. However, if the projecting part 21 is provided (Example 1) while keeping the length of the shaft-shaped part 19 in Comparative Example 2, the peak gain becomes larger than that in Comparative Example 2, so drop of the peak gain from that in Comparative Example 1 is suppressed. Further, if the diameter of the projecting part 21 is made larger (example 2) relative to that in Example 1, the peak gain becomes larger relative to that in Example 1, and further the peak gain becomes larger than that in Comparative Example 1 in which the shaft-shaped part 19 is not made shorter.

As described above, in comparison with the comparative examples each having a first conductor configured by only the shaft-shaped part 19, it was confirmed that the shaft-shaped part 19 could be made shorter while suppressing a drop in the peak gain by providing the projecting parts 21.

Example 3 and Comparative Examples 3 and 4

Example 3 is an example set with specific dimensions with respect to the antenna 1 in the first embodiment having the shape explained with reference to FIG. 2.

Figure 5A:
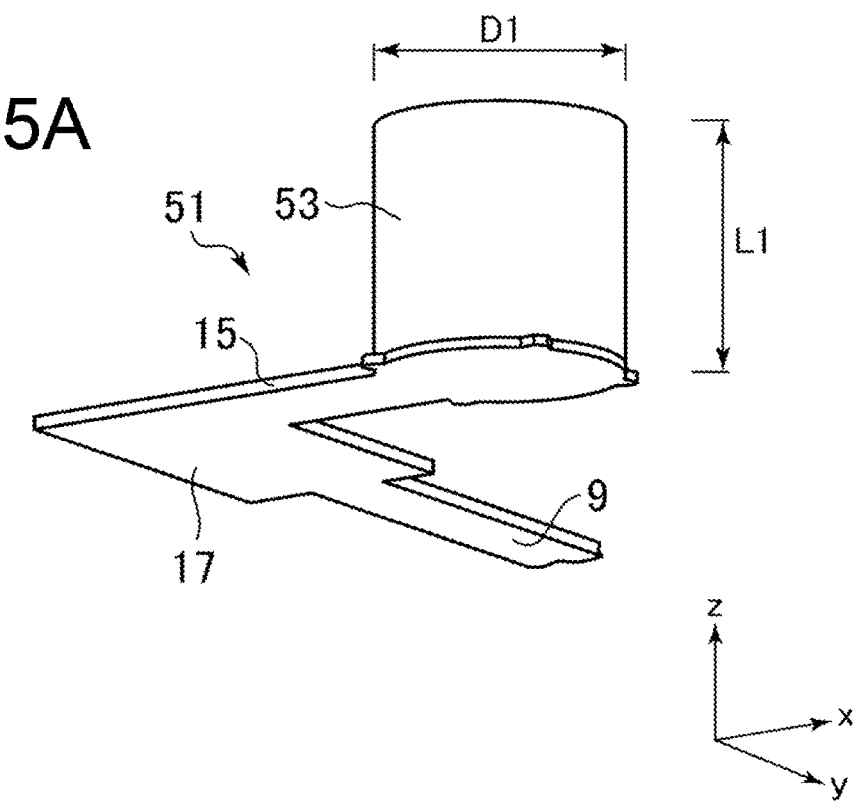
FIG. 5A and FIG. 5B are perspective views showing antenna conductors according to Comparative Examples 3 and 4.

FIG. 5A is a perspective view showing an antenna conductor 51 according to Comparative Example 3. The antenna conductor 51 differs from the first embodiment only in the point that a first conductor 53 corresponding to the first conductor 13 in the embodiment is columnar shaped.

Figure 5B:
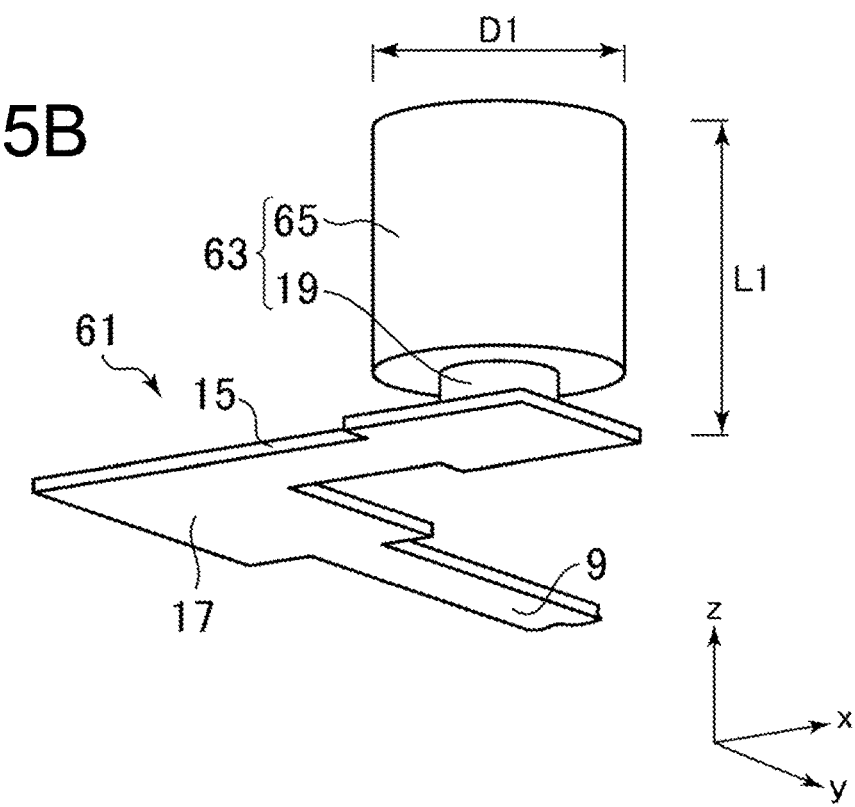

FIG. 5B is a perspective view showing an antenna conductor 61 according to Comparative Example 4. The antenna conductor 61 differs from the first embodiment only in the shape of the first conductor 63 corresponding to the first conductor 13 in the embodiment. Specifically, the first conductor 63 becomes larger in diameter on the tip end side compared with the root side.

The first conductor 63 can be grasped as being provided with a shaft-shaped part 19 and a projecting part 65 projecting from the shaft-shaped part 19 as well. The projecting part 21 in the embodiment is different compared with the projecting part 65 in Comparative Example 4 in a point that a plurality are provided, a point that they are separated from the two ends of the shaft-shaped part 19, and/or a point that they are flange-shaped (relatively thin) etc.

The diameter D1 of the projecting part 21 in Example 3, the diameter D1 of the first conductor 53 in Comparative Example 3, and the diameter D1 of the projecting part 65 in Comparative Example 4 are the same as each other and are 0.3 mm. The diameters of the shaft-shaped parts 19 in Example 3 and Comparative Example 4 are the same as each other and are 0.1 mm. The length L1 of the shaft-shaped part 19 in Example 3, the length L1 of the first conductor 53 in Comparative Example 3, and the length L1 of the first conductor 63 in comparative example 4 are the same as each other and are 0.36 mm. The number of the projecting parts 21 in Example 3 is five.

The simulation computation results of Example 3 and Comparative Examples 3 and 4 are as follows:

|  | Peak gain (dBi) |
| --- | --- |
| Ex. 3 | 1.73 |
| Comp. Ex. 3 | 1.52 |
| Comp. Ex. 4 | 1.67 |

In Example 3, the peak gain becomes larger than that in Comparative Example 3. It is seen from this that the increase of the peak gain due to the provision of the projecting parts 21 is not only due to the increase of the volume of the first conductor 13.

In Comparative Example 4, the peak gain becomes larger than that in Comparative Example 3. As the reason for this, the following reasons can be mentioned. In Comparative Example 4, compared with Comparative Example 3, the area of the transverse plane at the connection position of the first conductor and the second conductor 15 becomes smaller. Accordingly, disruption in the directivity of the current in the first conductor and/or second conductor 15 is reduced, so the peak gain becomes higher.

In Example 3 as well, in the same way as Comparative Example 4, the area of the transverse plane at the connection position of the first conductor 13 and the second conductor 15 becomes smaller. Accordingly, in Example 3 as well, in the same way as Comparative Example 4, the effect of reducing the disruption in the directivity of the current is exerted.

However, in Example 3, the peak gain becomes larger than that in Comparative Example 4. It is seen from this that the reason for the increase of the peak gain by providing the projecting parts 21 is not only the reduction of the cross-sectional area at the connection position of the first conductor 13 and the second conductor 15.

As described above, the antenna 1 according to the present embodiment is provided with a first conductor 13 which includes the shaft-shaped part 19 and plurality of flange-shaped projecting parts 21 which project from the shaft-shaped part 19 to directions crossing the axial direction of the shaft-shaped part 19.

Further, from another viewpoint, the antenna 1 according to the present embodiment is provided with a first conductor 13 which includes the shaft-shaped part 19 and at least one flange-shaped projecting part 21 which projects from the shaft-shaped part 19 to directions crossing the axial direction of the shaft-shaped part 19 at a position in the shaft-shaped part 19 which is separated from the two ends of the axial direction thereof.

Accordingly, for example, as confirmed by the examples and comparative examples explained above, by providing the projecting parts 21, the first conductor 13 can be made shorter while suppressing a drop in the antenna characteristics (for example peak gain). Accordingly, this is advantageous for reducing the size.

When a plurality of projecting parts 21 are provided, for example, according to a comparison between Example 3 and Comparative Example 4, the antenna characteristics are improved compared with a case where only one projecting part 21 is provided. Note that, as will be explained later, in the simulation computation results according to a modification (FIG. 7), the antenna characteristics tended to be improved more the larger the number of the projecting parts 21.

When the projecting part 21 is separated from the two ends of the shaft-shaped part 19, for example, the areas of the transverse planes on the two end sides of the shaft-shaped part 19 become smaller. As a result, for example, the disruption in the current is reduced in the first conductor 13 as a whole, and the antenna characteristics are improved. Note that, as one reason for the peak gain having become higher in Example 3 compared with Comparative Example 4 in which the transverse plane of the entire part on the tip end side of the first conductor 63 is larger, separation of the projecting part 21 from the tip ends may be considered. Further, as will be explained later, in the simulation computation results according to the modification (FIG. 7), further improvement of the antenna characteristics was shown in a case where the projecting part 21 was suitably separated from the two ends compared with the case where the projecting part 21 was positioned on the two end sides.

Further, in the present embodiment, the projecting parts 21 are disk-shaped ones projecting so as to surround the periphery of the shaft-shaped part 19.

In this case, no matter from which orientation around the shaft-shaped part 19 the first conductor 13 is viewed, each projecting part 21 appears to have a substantially uniform amount of projection. As a result, the effect of providing the projecting part 21 can be obtained over a broad range around the shaft. That is, the antenna characteristics (for example gain) can be improved over a broad range around the shaft.

Further, in the present embodiment, there are three or more projecting parts 21. They are positioned at equal intervals from each other in the axial direction of the shaft-shaped part 19. For the advantageous effect thereof, see the explanation of the modification which will be explained later.

Further, in the present embodiment, the antenna 1 is further provided with the second conductor 15 which is connected to one end of the shaft-shaped part 19 so as to intersect with the axial direction of the shaft-shaped part 19.

In this case, the entirety of the L-shape of to the first conductor 13 and second conductor 15 can handle circular polarization as already explained. In such a configuration, if the length of the first conductor 13 can be made shorter by providing the projecting parts 21 in the first conductor 13, for example, it is possible to deal with the circular polarization even in a case where it is hard to secure the area of the antenna 1 facing the direction of emission and/or reception. As a result, for example, it becomes possible to determine the direction from the side surface of the first substrate 5 to the direction which this side surface faces as the direction of emission and/or reception of the circular polarization. From another viewpoint, the first substrate 5 can be made thinner.

Further, in the present embodiment, the antenna 1 is further provided with the third conductor 17 which is connected to one end of the second conductor 15 and intersects with the axial direction of the shaft-shaped part 19 and with the direction crossing the axial direction.

In this case, for example, an L-shape facing the direction crossing the direction to which the L-shaped formed by the first conductor 13 and second conductor 15 faces is formed by the second conductor 15 and third conductor 17, therefore it can possible to handle circular polarization with respect to a broad orientation. In such a configuration, if the length of the first conductor 13 can be made shorter by providing the projecting parts 21 in the first conductor 13, for example, the antenna conductor 7 (13, 15, and 17) can be shaped thin as a whole. As a result, for example, provision in a thin type member such as the first substrate 5 is facilitated.

Further, in the present embodiment, the first substrate 5 having a dielectric is further provided. The shaft-shaped part 19 is positioned in at least a portion in the internal portion of the first substrate 5, and its axial direction and the thickness direction of the first substrate 5 are parallel. There are a plurality of projecting parts 21 which are along the surface direction of the first substrate 5 and are spaced apart from each other in the thickness direction.

In this case, for example, a substrate built-in antenna having the direction to which the side surface of the first substrate 5 faces as the emission and/or reception direction of radio waves is realized. Further, the shaft-shaped part 19 can be made shorter by providing the projecting parts 21, therefore this is advantageous for making the first substrate 5 thinner. Further, the first substrate 5 is configured by a multilayer substrate, and the shaft-shaped part 19 and projecting parts 21 can be realized by utilizing the via conductors 25 and conductor layers 27 in the multilayer substrate, therefore a special manufacturing equipment and process are unnecessary.

Modifications

FIG. 6A to FIG. 7E are perspective views showing antenna conductors of antennas according to modifications. In all of them, only the number of projecting parts 21, diameter, and/or position (z-direction) are different from those in the embodiment.

Figure 6A:
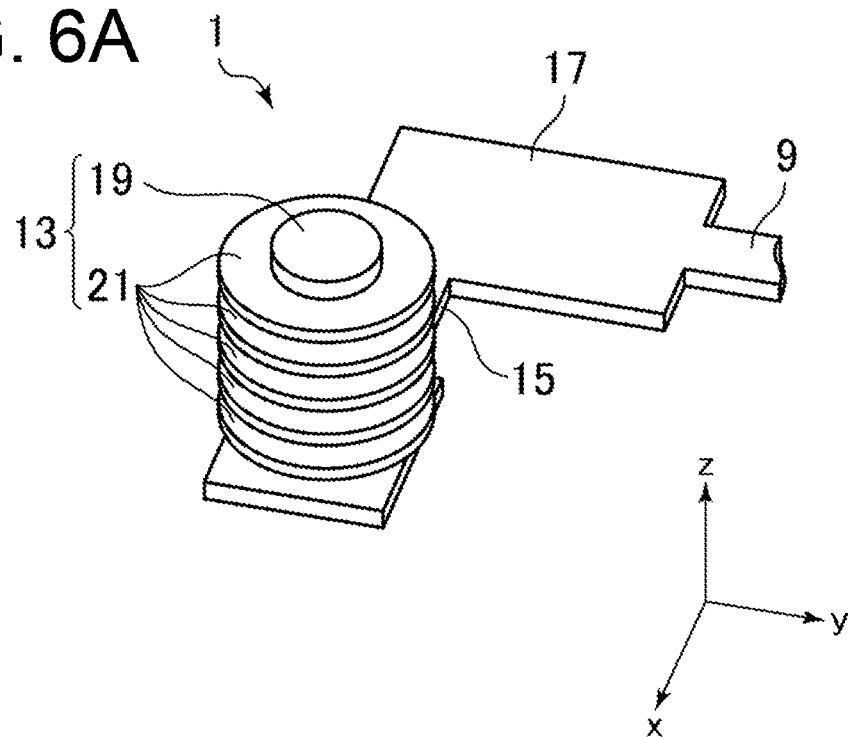
FIG. 6A and FIG. 6B are perspective views showing antennas according to modifications.

The antenna 1 shown in FIG. 6A is different from the antenna 1 shown in FIG. 1 to FIG. 3 in only the diameter of the projecting part 21 and is assigned the same notations as those in FIG. 2. In FIG. 6A, the diameter of the projecting part 21 is made larger than FIG. 1. For example, in FIG. 1, the diameter of the projecting part 21 is smaller than the length of one side of the rectangle at the end part of the second conductor 15 (the portion broadened in width). In FIG. 6A, however, the diameter of the projecting part 21 becomes larger than the length of one side of the rectangle in the end part of the second conductor 15.

Figure 6B:
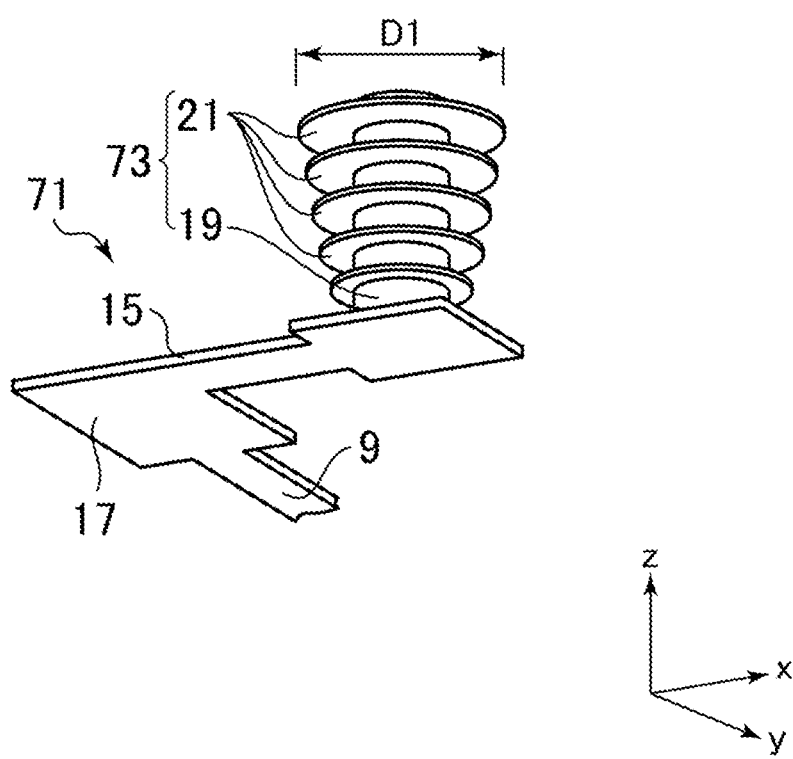

In an antenna 71 shown in FIG. 6B, a first conductor 73 has five projecting parts 21 in the same way as the first conductor 13. However, the diameters of the projecting parts 21 become smaller toward the lower end side. Note that, in a case where the diameter D1 of the largest one among the plurality of projecting parts 21 in the first conductor 73 and the diameter D1 of the first conductor 13 are made the same, and the other conditions are made the same between the first conductor 13 and the first conductor 73, the peak gain is higher in the first conductor 13. The tendency of this may be the same as the result that the example having a larger diameter of projecting part 21 between the first example and the second example had a higher peak gain.

In an antenna 81 shown in FIG. 7A, a first conductor 83 has three projecting parts 21 at equal intervals. Note that, a distance between the upper end of the shaft-shaped part 19 and the projecting part 21 closest to this upper end and a distance between the lower end of the shaft-shaped part 19 and the projecting part 21 closest to this lower end are shorter than the interval between the projecting parts 21.

In an antenna 91 shown in FIG. 7B, a first conductor 93 has two projecting parts 21 closer to the upper end of the shaft-shaped part 19. Specifically, the projecting part 21 in a lower part is positioned at the vicinity of the center in the axial direction of the shaft-shaped part 19. The distance between the upper end of the shaft-shaped part 19 and the projecting part 21 in the upper part becomes shorter than the interval between the projecting parts 21. Note that, the first conductor 93 has a shape removing the projecting part 21 in the lowest part from the first conductor 83 in FIG. 7A.

In an antenna 101 shown in FIG. 7C, a first conductor 103 has two projecting parts 21. The two projecting parts 21 are arranged so that intervals among the four of the upper end of the shaft-shaped part 19, the projecting part 21 in the upper part, the projecting part 21 in the lower part, and the lower end of the shaft-shaped part 19 become equal.

In an antenna 111 shown in FIG. 7D, a first conductor 113 has two projecting parts 21 closer to the two ends of the shaft-shaped part 19. Note that, the first conductor 113 has a shape removing the projecting part 21 at the center from the first conductor 83 in FIG. 7A.

In an antenna 121 shown in FIG. 7E, a first conductor 123 has two projecting parts 21 closer to the upper end of the shaft-shaped part 19. Note that, the first conductor 123 has a shape moving the projecting part 21 in the lower part upward in the first conductor 93 in FIG. 7B.

For the antennas in FIG. 7A to FIG. 7E, simulation computations were carried out by making the conditions other than the numbers of projecting parts 21 and their positions (z-direction) the same as each other. When explaining these in order from the one having the highest peak gain, the order becomes FIG. 7A, FIG. 7B, FIG. 7C, FIG. 7D, and FIG. 7E.

According to the result that the peak gain in FIG. 7A became the highest, preferably the number of the projecting parts 21 is larger. Further, according to the result that the peak gain in FIG. 7C became higher than the peak gains in FIG. 7D and FIG. 7E, preferably the projecting parts 21 are separated from the two ends of the shaft-shaped part 19 compared with the case where they are positioned closer to the two ends or one end of this part. However, according to the result that the peak gain in FIG. 7B became higher than the peak gain in FIG. 7C, when there is a projecting part 21 which is sufficiently separate from the two ends, all of the projecting parts 21 need not always be separated from the two ends.

FIG. 8A to FIG. 8D are cross-sectional views showing modifications of the shaft-shaped part (via conductors).

Note that, in the same way as the via conductor 25 and conductor layer 27 explained with reference to FIG. 3, even in these modifications, the via conductors and conductor layers may be configured by suitable materials. It does not matter whether the material is single or whether the materials are the same between the via conductors, between the conductor layers, or between the via conductor and the conductor layer. It also does not matter whether or not the conductor layer is positioned between the via conductors (the parts may be as shown in the views or may be different from illustration).

Further, these views illustrate a case where the shaft-shaped part is configured by two via conductors and only one projecting part 21 is formed. However, the shaft-shaped part may be configured by three or more via conductors. Two or more projecting parts 21 may be provided. The shape on the transverse plane (xy cross-section) of the via conductor may be a suitable shape. It is for example circular.

Figure 8A:
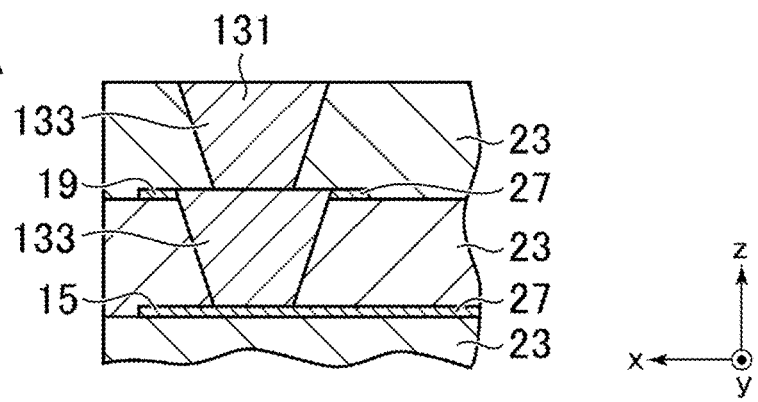
FIG. 8A, FIG. 8B, FIG. 8C, and FIG. 8D are cross-sectional views showing modifications of shaft-shaped parts in the antennas.

A shaft-shaped part 131 in FIG. 8A is configured by inverse-tapered shape solid via conductors 133. Each inverse-tapered shape is a shape with an area of the transverse plane becoming larger toward the upper end side of the shaft-shaped part 131. For example, when viewed on a cross-section, it is substantially a trapezoid with the upper bottom facing the lower part. Between the via conductors 133 abutting against each other, for example, the lengths of the upper bottoms of the trapezoids are substantially the same as each other, and the lengths of the lower bottoms of the trapezoids are substantially the same as each other. Accordingly, the shape of the shaft-shaped part 131 as a whole is repetition of gradual diameter expansion and rapid diameter contraction from the lower end to the upper end. Note that, the lower bottom of the trapezoid and the upper bottom of the trapezoid abutting against this lower bottom may be given the same lengths so that the diameter gradually expands from the lower end to the upper end as well. The same is true for the inverse tapers in the other modifications.

Figure 8B:
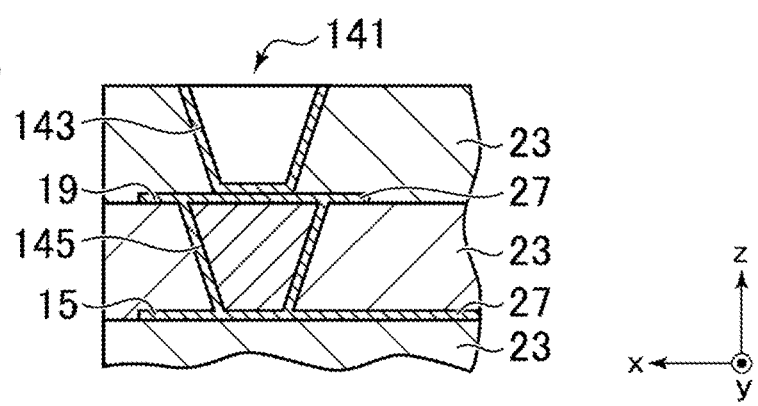

A shaft-shaped part 141 in FIG. 8B is configured by a via conductor 143 passing through the dielectric layer 23 configuring the upper surface and a via conductor 145 passing through the second and following dielectric layers 23 from the upper surface. The via conductor 143 is configured by a conductor as a film formed on the inner circumferential surface of the hole passing through the dielectric layer 23 and is hollow. In the via conductor 145, at least a portion configuring the outer circumferential surface is configured by a conductor, and the internal portion thereof is a conductor or insulator. When the internal portion is the insulator, the via conductor 145 can be said to be hollow as the antenna conductor. Accordingly, the shaft-shaped part 141, as the antenna conductor, is hollow-shaped in a portion on the upper end side or in the entirety from the lower end to the upper end (however, the boundary between the via conductors is excluded). Note that, such a configuration is for example formed by build-up from the −z side. Here, the via conductors 143 and 145, in the same way as FIG. 8A, are inverse taper-shaped. However, they may be given cross-sectional shapes that are uniform in the z-direction as well.

Figure 8C:
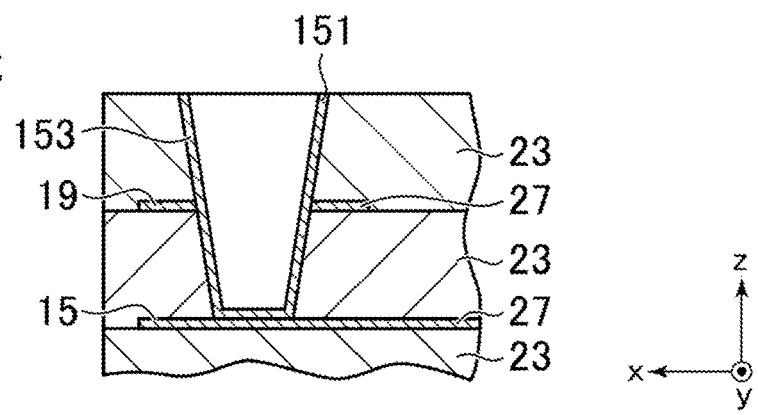

A shaft-shaped part 151 in FIG. 8C is configured by a hollow via conductor 153 formed through a plurality of dielectric layers 23. That is, the shaft-shaped part 151 is hollow shaped. Note that, such a via conductor 153 for example may be formed in a "skip via" in the build-up method or may be formed in a through-hole in a through-hole substrate. The via conductor 153 and the via conductor 145 in FIG. 8B may be combined as well. Here, the via conductor 154 is an inverse taper-shape in the same way as FIG. 8A, but may be given a cross-sectional shape uniform in the z-direction as well.

Figure 8D:
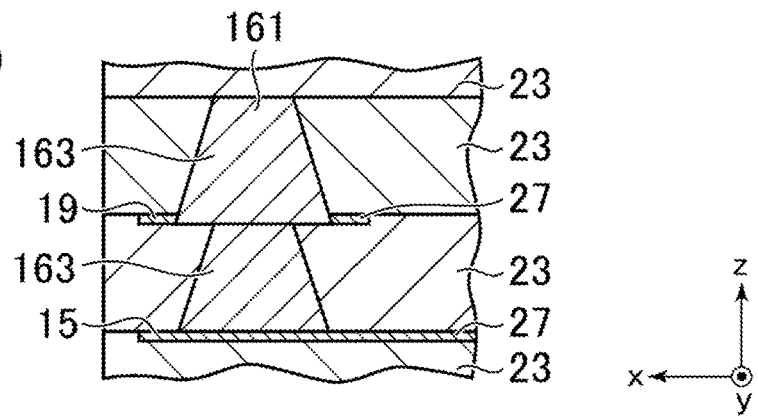

A shaft-shaped part 161 in FIG. 8D is configured by solid via conductors 163 of forward tapered shapes (for example with cross-sections which are substantially trapezoid). The shape of each via conductor 163 or shaft-shaped part 161 is the same as that in FIG. 8A excluding the upside-down direction. Such a shape is for example realized by the build-up method of building up the dielectric layers 23 from the +z side to the −z side.

Although not particularly shown, as understood from FIG. 8A and FIG. 8D, by forming the first conductors from the tip end sides of the first conductors (inverse sides to the second conductors 15), forward tapered shapes can be realized in the shaft-shaped parts of FIG. 8B and FIG. 8C in which at least parts are hollow as the antenna conductors as well. Note that, in this case, the internal portion of each hollow shaft-shaped part may be filled with the insulator from the second conductor side or may be closed as a cavity as it is by the dielectric layer 23 separating the first conductor and the ground plate 11. Further, the second conductor 15 is connected with the outer periphery of the lower end of the hollow shaft-shaped part.

Second Embodiment

FIG. 9 is a perspective view showing an antenna conductor 207 in an antenna 201 according to a second embodiment.

The antenna 201 differs from the antenna 1 in the first embodiment only in the shapes of the projecting parts. The rest is the same as the first embodiment. Specifically, while the projecting part 21 (each) in the antenna 1 was flange-shaped and projected from the shaft-shaped part 19 over a relatively broad range around the shaft of the shaft-shaped part 19, a projecting part 221 (each) in the antenna 201 does not always cover a relatively broad range around the shaft of the shaft-shaped part 19. However, by the plurality of projecting parts 221 projecting in directions different from each other, the plurality of projecting parts 221 as a whole cover a relatively broad range around the shaft of the shaft-shaped part 19. Specifically, this is as follows.

The shapes of the plurality of projecting parts 221 are for example the same as each other. Each projecting part 221 for example has two projection pieces 223 projecting from the shaft-shaped part 19 to opposite directions. Note that, in this way, in the present disclosure, shapes that project from the same position of the shaft-shaped part 19 in the axial direction and from the plurality of positions around the shaft will be referred to as the "projecting pieces". Further, if the positions in the axial direction of the shaft-shaped part 19 are the same, the one or more projecting pieces as a whole will be referred to as the "projecting part". The same is true for a case where narrow notches are formed in the flange-shaped projecting part 21 in the first embodiment so that the projecting part 21 were divided.

Each projecting part 221, for example, projects from the shaft-shaped part 19 in a relatively narrow range around the shaft of the shaft-shaped part 19. For example, the projecting part 221 does not satisfy the condition illustrated as the range around the shaft of the flange-shaped projecting part 21 in the first embodiment (for example projection from the shaft-shaped part 19 in a range not less than 270°). However, the projecting part 221 may satisfy this condition as well.

Each projection piece 223 for example linearly projects. From another viewpoint, the shape of each projection piece 223 is a rectangular shape having the radial direction of the shaft-shaped part 19 as the long direction. Note that, each projection piece 223 may have a portion that expands more in width toward the outer side and/or a portion that becomes narrower toward the outer side.

Each projecting part 221 has the shape as described above. Therefore, in only one projecting part 221, when viewed in the radial direction having the shaft-shaped part 19 as the axial center, there is an orientation in which the projecting part 221 is not seen or becomes extremely small. In such an orientation, the effect of providing the projecting part 221 is reduced. Therefore, by making the projection directions of the plurality of projecting parts 221 (for example the directions in which the amounts of projection become the maximum) intersect with each other at suitable intersection angles, such an inconvenience is eliminated.

Specifically, in the example shown, five (may be four) projecting parts 221 are provided with projection directions made different from each other by 45° each. From another viewpoint, the projection directions are made to obliquely intersect with each other. Due to this, the effect of providing the projecting parts 221 for a broad orientation around the shaft of the shaft-shaped part 19 can be obtained. Note that, the five projecting parts 221 are provided with projection directions made different from each other by 45° each, therefore two projecting parts 221 have the same orientation as each other. This orientation is an orientation perpendicular to the y-direction forming the side of the side surface of the first substrate 5 in the example shown. That is, when viewed in the direction that the side surface of the first substrate 5 faces, the effect of the projecting parts 221 becomes the greatest.

As described above, in the second embodiment, the antenna 201 is provided with the first conductor 213 which includes the shaft-shaped part 19 and the plurality of projecting parts 221. The plurality of projecting parts 221 project from the shaft-shaped part 19 in directions crossing the axial direction of the shaft-shaped part 19 and are different from each other in the positions in the axial direction of the shaft-shaped part 19. Further, the orientations where the amount of projections from the shaft-shaped part 19 are the maximum cross with each other.

In such a configuration, the projecting parts 221 need not be formed in flange shapes. Therefore, for example, the principle of the present disclosure can also be applied to an antenna configured by combining metal rods (solid or hollow).

Example of Utilization of Antenna (Assembly)

Figure 10A:
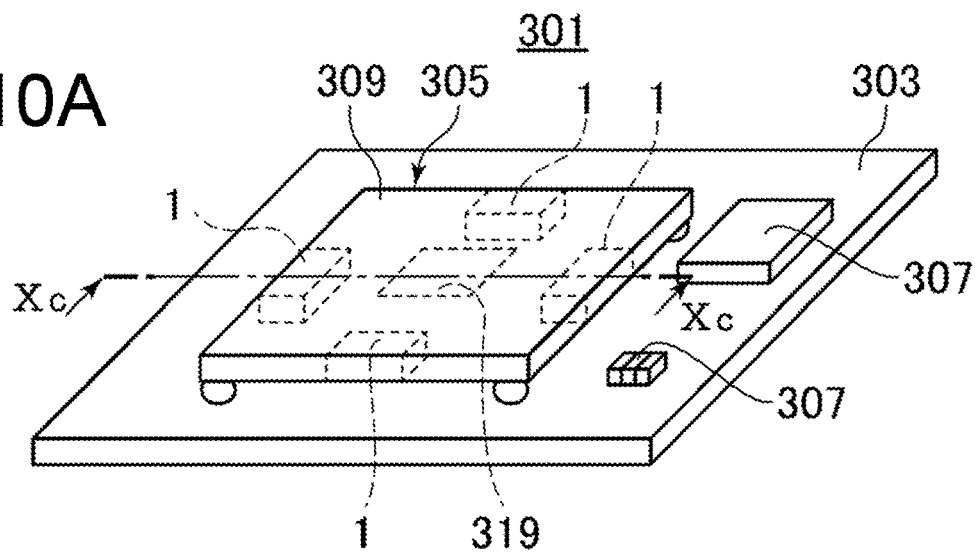
FIG. 10A and FIG. 10B are perspective views showing assemblies as examples of utilization of the antenna.
Figure 10B:
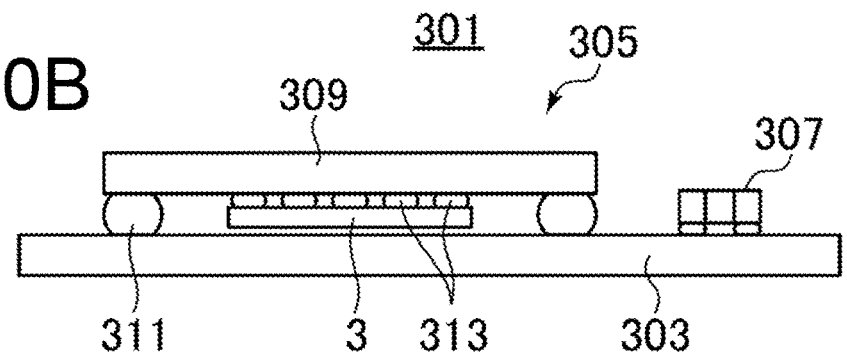

FIG. 10A is a perspective view showing an assembly 301 including the antenna 1. FIG. 10B is a side view of the assembly 301. Note that, in the following explanation, use will be made of the notations in the antenna 1 in the first embodiment. However, the antenna according to modifications or the second embodiment may be provided in place of the antenna 1.

The assembly 301 is for example included in a portable terminal or another electronic apparatus and performs communication through radio waves. The assembly 301 for example includes a main substrate 303, a module 305 including the antenna 1 and mounted on the main substrate 303, and other electronic parts 307 mounted on the main substrate 303.

The main substrate 303 is for example a rigid type printed circuit board or FPC (flexible printed circuit). Although not particularly shown, it is configured by providing wiring lines and pads etc. on an insulation substrate. The electronic parts 307 are for example an IC, resistor element, capacitor, inductor, switch, connector, or sensor. Any of these electronic parts 307 may be electrically connected through the main substrate 303 with the module 305 as well.

(Module)

The module 305 includes for example a module substrate 309 including the antenna 1 and an IC 3 which is mounted on the module substrate 309 and is shown also in FIG. 1. Note that, the module 305, other than the IC 3, may be provided with an electronic part 307 mounted on the module substrate 309 as well. It is also possible to mount the IC 3 on a substrate other than the module substrate 309 (for example the main substrate 303) and connect it with the antenna 1.

The module substrate 309 is for example mounted on the main substrate 303 through bumps 311 so that its major surface (the broadest surface in the plate shape, below, same is true for other substrates) is made to face the major surface of the main substrate 303. Note that, the module substrate 309 may be connected with the main substrate 303 by a method different from FIG. 10. For example, it may be inserted into a connector provided on the main substrate 303.

The IC 3 is for example mounted through bumps 313 on the major surface of the module substrate 309 which faces the main substrate 303. The bumps 313 are for example interposed between not shown pads formed on the surface of the IC 3 and pads 315 of the module substrate 309 (one type of land in a broad sense, FIG. 10C) and bond them. Note that, the IC 3 may be mounted on the major surface of the module substrate 309 on the side opposite to the main substrate 303 as well. Further, the IC 3 may have leads formed so as to project out in place of the pads provided in a layered shape on its surface so that it is mounted by through-hole mounting where that the leads are inserted into the module substrate 309 or is mounted by bonding of the leads and the pads 315.

(Module Substrate)

Figure 10C:
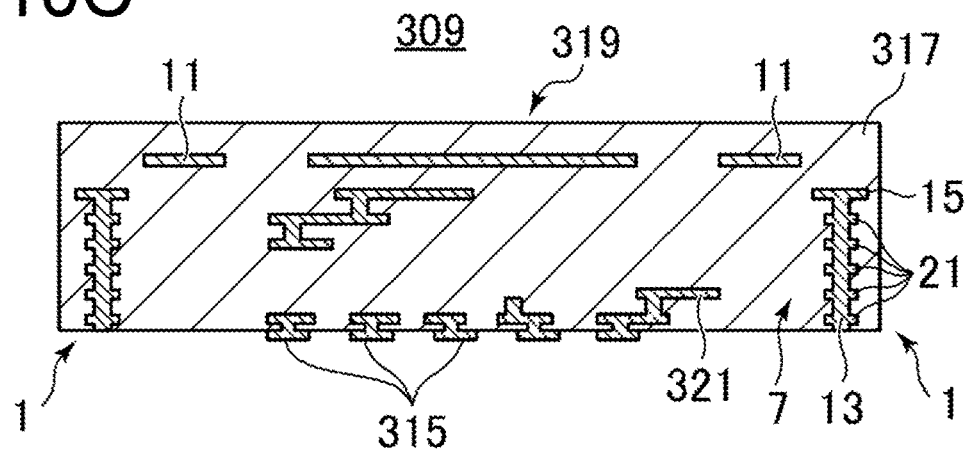
FIG. 10C is a cross-sectional view taken along the Xc-Xc line in FIG. 10A of a module substrate included in the assembly.

FIG. 10C is a cross-sectional view showing the module substrate 309 and corresponds to the Xc-Xc line in FIG. 10A.

The module substrate 309 is for example configured by a rigid type printed circuit board and has a second substrate 317 configured by an insulator and various conductors provided in the second substrate 317. The module substrate 309 is for example a multilayer substrate and includes the multilayer substrate configuring each antenna 1 as a part thereof as shown in FIG. 10A and FIG. 10C. Accordingly, the explanation already given for the multilayer substrate configuring each antenna 1 may be applied to the explanation for the module substrate 309 except for the details.

For example, the second substrate 317 has a plurality of dielectric layers 23 (FIG. 3) which are stacked on each other. The layers in part or all of the plurality of dielectric layers 23 are utilized for configuration of the antennas 1 by parts of their regions. That is, the second substrate 317 includes the first substrate 5. Note that, FIG. 10C illustrates a case where provision is further made of a dielectric layer 23 covering the ground plate 11 in addition to the plurality of dielectric layers 23 shown in FIG. 3. Further, the conductors provided in the second substrate 317 are via conductors 25 and conductor layers 27 (FIG. 3) etc. Some are utilized for configuring the antenna conductor 7 and ground plate 11.

The materials and shapes etc. of the dielectric layers 23, via conductors 25, and conductor layers 27 are as already explained in the explanation for the multilayer substrate configuring each antenna 1. Further, any one or more among the via conductors 25 shown in FIG. 3 and the via conductors according to the modifications shown in FIGS. 8A to 8D may be combined and provided in the module substrate 309 as well.

The module substrate 309 for example has the antennas 1 on the side-surface sides. For example, the antenna conductor 7, when viewed on a plane, is closer to the side surface of the module substrate 309 than the center in the figure of the module substrate. Further, for example, the side surface on the −y side of the first substrate 5 in FIG. 1 to FIG. 3 configures a portion of one side surface of the second substrate 317. From another viewpoint, for example, another conductor is not interposed between the antenna conductor 7 and a region in the one side surface of the second substrate 317 which overlaps the antenna conductor 7 when viewed in the direction perpendicular to the one side surface, or there is no another conductor on the side closer to the one side surface than the antenna conductor 7 over the entire surface of the one side surface. By arranging the antenna 1 in this way, for example, the gain of emission and/or reception of radio waves with respect to the lateral side of the module substrate 309 becomes larger.

Further, the module substrate 309 is for example rectangular when viewed on a plane and has the antenna 1 positioned on the side of the side surface as described above at each of its four side surfaces. These four antennas 1 for example are designed to handle radio waves having the same frequencies as each other.

Note that, the antenna 1 may be provided on the center side in the module substrate 309 or may be provided so that the orientation in which the −y side in FIG. 3 is directed may be replaced by an orientation other than that described above in the case where the antenna 1 is provided on the center side or the side of the side surface. Further, the number of antennas 1 is a suitable number. For example, only one may be provided, they (only two in total) may be provided for only a pair of side surfaces which are positioned on the opposite sides to each other, or a larger number of antennas than those in the example shown may be provided. A plurality of antennas 1 handling frequencies which are different from each other may be provided as well.

The module substrate 309, other than the antennas 1, for example has an antenna 319, already explained pads 315, not shown pads for mounting the module substrate 309 on the main substrate 303, and wiring lines 321 for suitably connecting them. The wiring lines 321 and pads 315 (and other pads) are for example positioned closer to the center side of the second substrate 317 than the first conductor 13.

The configuration of each antenna 319 may be a suitable one. FIG. 10A and FIG. 10C illustrate a case where the antenna 319 is configured by one patch antenna. Other than this, the antenna 319 may be configured by for example a helical antenna, two dipole antennas, or an array antenna configured by a plurality of patch antennas and the like. Further, for example, the antenna 319 may be configured by an L-shaped conductor shown in the present disclosure as well (see for example second conductor 15 and third conductor 17).

The pads 315 are for example configured by the conductor layer 27 positioned on the major surface of the second substrate 317. Note that, as the pads 315, ones for mounting electronic parts 307 other than the IC 3 may be provided as well. Further, the module substrate 309, in place of or addition to the pads 315, may have a not shown land in a narrow sense for through-hole mounting the IC 3 or other electronic parts 307 as well.

Note that, the term of "land" designates a conductor pattern for through-hole mounting (narrow sense), or designates a conductor pattern used for attachment and connection of the parts and includes pads for surface-mounting (broad sense). In the present disclosure, unless it will be particularly explained, the term designates the land in a broad sense.

The wiring lines 321 are for example configured by via conductors 25 and/or conductor layer 27. As the wiring lines 321, for example, one connecting the antenna conductor 7 with any of the plurality of pads 315, one connecting the ground plate 11 with any other one of the plurality of pads 315, one connecting the antenna 319 with any of the plurality of pads 315, and the like are provided. Other than these, a wiring line 321 for connecting the antenna conductors 7 with each other and/or wiring line 321 for connecting the ground plates 11 with each other may be provided.

(Operation of IC)

The operation of the IC 3 on the module substrate 309 is as follows.

The IC 3 for example performs modulation of a signal including information to be transmitted and raising of the frequency (conversion to a high frequency signal having a carrier frequency) and outputs the signal to the antenna 1 and/or antenna 319. In place of or addition to this operation, when receiving as input the signal from the antenna 1 and/or antenna 319, the IC 3 performs a frequency-down conversion and demodulation of this signal.

Note that, the potential when outputting the signal from the IC 3 to the antenna 1 and the potential when inputting the signal from the antenna 1 to the IC 3 are as already explained with reference to FIG. 1. Further, although not particularly shown, in the internal portion of the IC 3 or between the IC 3 and the antenna 1, filtering and amplification of signals may be suitably carried out. Further, although not particularly shown, where the antenna 1 is utilized for both transmission and reception, a duplexer is provided in the internal portion of the IC 3 or between the IC 3 and the antenna 1.

(Relationship Between Frequency Band and Length of Antenna)

As described above, the IC 3 performs output of an electrical signal in a predetermined frequency band to the antenna 1 and/or (boost-down of frequency and) demodulation of the electrical signal in the predetermined frequency band from the antenna 1. The lengths (L1, L2, and L3) of the first conductor 13, second conductor 15, and third conductor 17 in the antenna 1 are set so that the antenna functions as a monopole antenna using the wavelength of the radio wave (here, the wavelength $\lambda_g$ in the first substrate 5) in this predetermined frequency band as a reference. Further, by provision of the projecting parts 21, the first conductor 13 can be made shorter than the ¼ wavelength of the radio wave in the frequency band specified from the operation of this IC 3.

Note that, the frequency band has width, therefore the wavelength corresponding to the frequency band has width. In the module 305 which is worked (manufactured or sold or the like), when judging whether the length L1 of the first conductor 13 is shorter than the ¼ wavelength corresponding to the frequency band of the IC 3, for example, the wavelength $\lambda_g$ may be identified using the frequency at the center in the frequency band. Further, for example, the wavelength $\lambda_g$ may be identified using an actual frequency of the signal which is output by the IC 3.

Further, the frequency band in the module 305 which is worked may be identified from the operation of the IC 3 or may be identified from a pamphlet or specifications etc. of an apparatus including the module 305. Usually, the frequency band is based on an international or domestic wireless communication standard, therefore the frequency band may be identified by comparing the operation of the IC 3 and the standards.

The "frequency band" referred to here is the most subdivided one. For example, there can be mentioned each of the channels of the WiGig (bandwidth: 2.17 GHz) and the transmission band and reception band of each of the bands of the UMTS (Universal Mobile Telecommunications System). Note that, in a case where the antenna 1 is utilized for both transmission and reception, the entirety including the transmission band and reception band (for example each of the bands of the UMTS) may be determined as the frequency band for identifying the wavelength $\lambda_g$.

As already explained, the length of the monopole antenna is the ¼ wavelength in principle. However, in actuality, usually the length is made shorter than the ¼ wavelength with a shortening rate of several percent or less considering impedance adjustment etc. The length L1 of the first conductor 13 can be made shorter than the length after this adjustment.

The length L1 of the first conductor 13 may be made shorter by a desired ratio relative to $\lambda_g/4$ so far as the desired gain is obtained. Note that, in the simulation results in Comparative Example 1 and Example 2, while the length L1 of Example 1 was about 0.74 time the length L1 in Comparative Example 1, the peak gain in Example 1 is improved to about 1.06 times the peak gain in Comparative Example 1.

In the above description, the case where the lengths of the first conductor 13, second conductor 15, and third conductor 17 were made substantially the ¼ wavelength was explained. However, it is possible to control these lengths to $\lambda_g/4+n\times\lambda_g/2$ where "n" is an integer of 0 or more.

As described above, the module substrate 309 of the example of utilization of the antenna 1 is provided with the second substrate 317 which has a dielectric and includes the first substrate 5, the wiring lines 321 positioned in at least one of the internal portion or surface of the second substrate 317 in a region in the second substrate 317 which is closer to the center side than the first substrate 5, and the pads 315 which are positioned at the surface of the second substrate 317 in a region closer to the center side than the first conductor 13 and are connected to the wiring line 321.

Further, the module 305 of the example of utilization of the antenna 1 is provided with the module substrate 309 as described above and an electronic part mounted on the pads 315 (for example, an IC 3).

Accordingly, the antenna 1 is built-in the substrate, therefore is advantageous for integration and reduction of size of the module substrate 309 and/or module 305. Further, by provision of the projecting parts 21 on the first conductor 13 in the antenna 1, the module substrate 309 can be made thinner and a further reduction of size is achieved.

The present invention is not limited to the above embodiments and may be executed in various ways.

For example, the antenna is not limited to one according to the WiGig. For example, the antenna may be utilized in a frequency band of 30 kHz to 300 kHz, a frequency band of 300 kHz to 3000 kHz, a frequency band of 3 MHz to 30 MHz, a frequency band of 30 MHz to 300 MHz, a frequency band of 300 MHz to 3000 MHz, a frequency band of 3 GHz to 30 GHz, or a frequency band of 30 GHz to 300 GHz.

Further, as understood from the above description, the antenna is not limited to a relatively small-sized one. For example, an antenna in which the length of the first conductor is several tens of centimeters or a few meters or more may be provided in a steel tower or a building or other real estate or may be provided in a means of transport such as a ship. Further, the antenna may be provided outside the housing of the electronic apparatus with a length not less than a few centimeters or not less than several tens of centimeters.

The antenna may be one not having a second conductor, third conductor, ground plate, dielectric (first substrate or second substrate), and/or wire line. For example, the antenna may be one having the first conductor, having neither the second conductor nor third conductor, and handling linear polarization. Further, for example, the antenna may be one which is not provided with a ground plate and uses the ground, a car body, or housing in place of the ground plate. Further, the antenna need not be buried in the dielectric and may be set in length using the wavelength in the atmosphere as a reference. Further, the wire line may be provided outside the antenna.

Like in the embodiment in which the first conductor was combined with the second conductor or with the second conductor and third conductor and functioned as a portion of an antenna of a new type handling circular polarization, the first conductor may function as a portion of a suitable antenna. For example, two first conductors may be aligned in series to utilize the first conductors as portions of a dipole antenna.

In a case where the first conductor and other conductors are buried in the dielectric, the antenna is not limited to one configured by a multilayer substrate. For example, the antenna may be configured by injecting an uncured dielectric into a mold in which conductors are arranged. Further, the shape of the dielectric is not limited to a substrate shape.

The projecting parts may be provided not only at the first conductor, but also at the second conductor and/or third conductor. In a case where the first conductor is provided in the multilayer substrate, in the embodiment, the shaft-shaped part was configured by via conductors, and the projecting parts were configured by conductor layers. Converse to this, the shaft-shaped part may be configured by conductor layers and the projecting parts may be configured by via conductors as well.

The connection position of the first conductor and the second conductor, the connection position of the second conductor and the third conductor, or the connection positions of these conductors (not limited to the third conductor) and the wire line need not be the end parts in the conductors. For example, the phases etc. may be adjusted by offset of the connection positions from the end parts. Further, the third conductor may be connected to not the end part in the second conductor on the opposite side to the first conductor, but the end part in the second conductor on the first conductor side.

In the antenna conductor having the first conductor, second conductor, and third conductor, the wire line may be connected to not the third conductor, but the first conductor or second conductor. Note that, in a case where the antenna 1 has only the first conductor or only the first conductor and second conductor, clearly the conductor to which the wire line is to be connected is not the third conductor. Further, the transmission line is not limited to a microstrip line. It may be a coaxial cable or a strip line with conductor layers positioned on the two sides of a linear conductor.

REFERENCE SIGNS LIST

1 . . . antenna, 13 . . . first conductor, 19 . . . shaft-shaped part, and 21 . . . projecting part.

The invention claimed is:
1. An antenna, comprising
a first conductor, wherein the first conductor comprises
a shaft-shaped part and
a plurality of projecting parts being flange-shaped and projecting from the shaft-shaped part to directions crossing an axial direction of the shaft-shaped part;
a first substrate comprising a dielectric,
wherein at least a portion in the shaft-shaped part is located in an internal portion of the first substrate, the axial direction and a thickness direction of the first substrate are parallel, and the plurality of the projecting parts are along a surface direction of the first substrate and are spaced apart from each other in the thickness direction.

2. The antenna according to claim 1, wherein each of the plurality of projecting parts is a disk shape projecting configured to surround the periphery of the shaft-shaped part.

3. The antenna according to claim 1, wherein the plurality of projecting parts are three or more, and they are located in the axial direction at equal intervals to each other.

4. The antenna according to claim 1, wherein the shaft-shaped part is a cylindrical shape or columnar shape.

5. The antenna according to claim 1, further comprising a second conductor which is connected to one end of the shaft-shaped part configured to intersect with the axial direction.

6. The antenna according to claim 5, further comprising a third conductor which is connected to one end of the second conductor and intersects with the axial direction and with a direction crossing the axial direction.

7. The antenna according to claim 1, further comprising a second conductor which is connected to one end of the shaft-shaped part configured to intersect with the axial direction.

8. An antenna, comprising
a first conductor, wherein the first conductor comprises
a shaft-shaped part including an upper end and a lower end, and
a plurality of projecting parts being flange-shaped and projecting from the shaft-shaped part to directions crossing an axial direction of the shaft-shaped part at a position separated from two ends in the axial direction of the shaft-shaped part,
wherein each of the plurality of projecting parts is a disk shape projecting configured to surround the periphery of the shaft-shaped part, and the plurality of projecting parts including intervals there between,
a distance between the upper end of the shaft-shaped part and a projecting part of the plurality of projecting parts, which is closest to the upper end is shorter than the intervals between the plurality of projecting parts,
a distance between the lower end of the shaft-shaped part and the projecting part, which is closest to the lower end, is longer than the intervals between the plurality of projecting parts.

9. The antenna according to claim 8, further comprising a second conductor which is connected to one end of the shaft-shaped part configured to intersect with the axial direction.

10. The antenna according to claim 8, wherein the plurality of projecting parts are three or more, and they are located in the axial direction at equal intervals to each other.

11. An antenna, comprising
a first conductor, wherein the first conductor comprises
a shaft-shaped part and
a plurality of projecting parts which project from the shaft-shaped part to directions crossing an axial direction of the shaft-shaped part, which are different from each other in the positions in the axial direction, and in which orientations where the amount of projections from the shaft-shaped part are the maximum cross each other;
a first substrate comprising a dielectric,
wherein at least a portion in the shaft-shaped part is located in an internal portion of the first substrate, the axial direction and a thickness direction of the first substrate are parallel, and the plurality of the projecting parts are along a surface direction of the first substrate and are spaced apart from each other in the thickness direction.

12. The antenna according to claim 11, wherein: the first substrate comprises a plurality of dielectric layers which are stacked on each other, and the plurality of the projecting parts are located anywhere between the plurality of dielectric layers.

13. A module substrate, comprising: an antenna according to claim 11, a second substrate which comprises a dielectric and comprises a first substrate, a wiring line which is in at least one of an internal portion or surface of a second substrate in a region closer to a center side than the first conductor in the second substrate, and a land which is on the surface of the second substrate in the region on the center side and is connected to the wiring line.

14. The module, comprising: a module substrate according to claim 13 and an electronic part mounted on the land.

15. The module according to claim 14, wherein: the electronic part is connected to the first conductor, and configured to perform at least one of output of an electrical signal in a predetermined frequency band to the first conductor and demodulation of an electrical signal in a predetermined frequency band from the first conductor, and the length of the shaft-shaped part is shorter than ¼ wavelength in the first substrate of a radio wave in the predetermined frequency band.

* * * * *